US011831252B2

(12) United States Patent
Bain et al.

(10) Patent No.: US 11,831,252 B2
(45) Date of Patent: Nov. 28, 2023

(54) PIXELATED ELECTROSTATIC ADHESION

(71) Applicant: THE BOEING COMPANY, Chicago, IL (US)

(72) Inventors: David M. Bain, Ashburton (AU); Craig J. Turner, Logan City (AU); Peter W. Chew, Brisbane (AU); Brittany P. Chambers, Yeronga (AU)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 17/544,575

(22) Filed: Dec. 7, 2021

(65) Prior Publication Data

US 2023/0179124 A1  Jun. 8, 2023

(51) Int. Cl.
  *H02N 13/00* (2006.01)
  *B25J 15/00* (2006.01)
  *H01L 21/683* (2006.01)

(52) U.S. Cl.
  CPC .......... *H02N 13/00* (2013.01); *B25J 15/0085* (2013.01); *H01L 21/6833* (2013.01); *B25J 15/0033* (2013.01)

(58) Field of Classification Search
  CPC ..... H02N 13/00; H01L 21/687; H01L 21/683; H01L 21/6833; H01L 21/6831; H01L 21/68707; B25J 15/00; B25J 15/0085
  USPC .......................................................... 361/234
  See application file for complete search history.

(56) References Cited

U.S. PATENT DOCUMENTS

| 2010/0116990 | A1* | 5/2010 | Xu | B24B 37/005 |
| | | | | 250/370.01 |
| 2012/0134065 | A1* | 5/2012 | Furuya | H01L 21/6833 |
| | | | | 361/234 |
| 2014/0036404 | A1* | 2/2014 | Prahlad | H02N 13/00 |
| | | | | 361/234 |
| 2015/0228513 | A1 | 8/2015 | Parkhe et al. | |
| 2015/0298320 | A1 | 10/2015 | Eisele et al. | |
| 2017/0004988 | A1 | 1/2017 | Sadjadi et al. | |

(Continued)

OTHER PUBLICATIONS

K. H. Koh, R. M. Kuppan Chetty and S. G. Ponnambalam, "Modeling and simulation of Electrostatic Adhesion for Wall Climbing Robot," 2011 IEEE International Conference on Robotics and Biomimetics, Karon Beach, Phuket, 2011, pp. 2031-2036, doi: 10.1109/ROBIO.2011.6181590 [Abstract Only].

(Continued)

*Primary Examiner* — Danny Nguyen
(74) *Attorney, Agent, or Firm* — Patterson + Sheridan, LLP

(57) ABSTRACT

Control for pixelated electrostatic adhesion can be provided by a voltage converter configured to increase an input voltage to an output voltage; a first gripping circuit, configured to selectively provide the output voltage at a first polarity to a first subset of electrodes of a plurality of electrodes; a second gripping circuit, configured to selectively provide the output voltage at a second polarity opposite to the first polarity to a second subset of electrodes of a plurality of electrodes that are associated with and different from the first subset of electrodes; a first release circuit, configured to selectively reverse the output voltage provided to the first subset of electrodes to the second polarity; and a second release circuit, configured to selectively reverse the output voltage provided to the second subset of electrodes to the first polarity.

20 Claims, 22 Drawing Sheets

(56) References Cited

U.S. PATENT DOCUMENTS

2018/0122680 A1* 5/2018 Yang .............. H01J 37/32715
2018/0374736 A1* 12/2018 Kumar ............ H01L 21/02057
2019/0240845 A1 8/2019 Hart et al.
2020/0313577 A1 10/2020 Mici et al.

OTHER PUBLICATIONS

J Guo et al., "Investigation of relationships between interfacial electroadhesive force and surface texture," 2016 J. Phys. D: Appl. Phys. 49 035303.
Brecher, C. & Kukla, Christian & Schares, Richard & Emonts, M.. (2015). Electrostatic grippers for lightweight productions—Form- and area-adaptive electrostatic gripper systems for high-performance materials. WT Werkstattstechnik. 105. 567-572.
European Patent Office, extended European Search Report for Application 22194753.4-1002 dated Aug. 5, 2023.

* cited by examiner

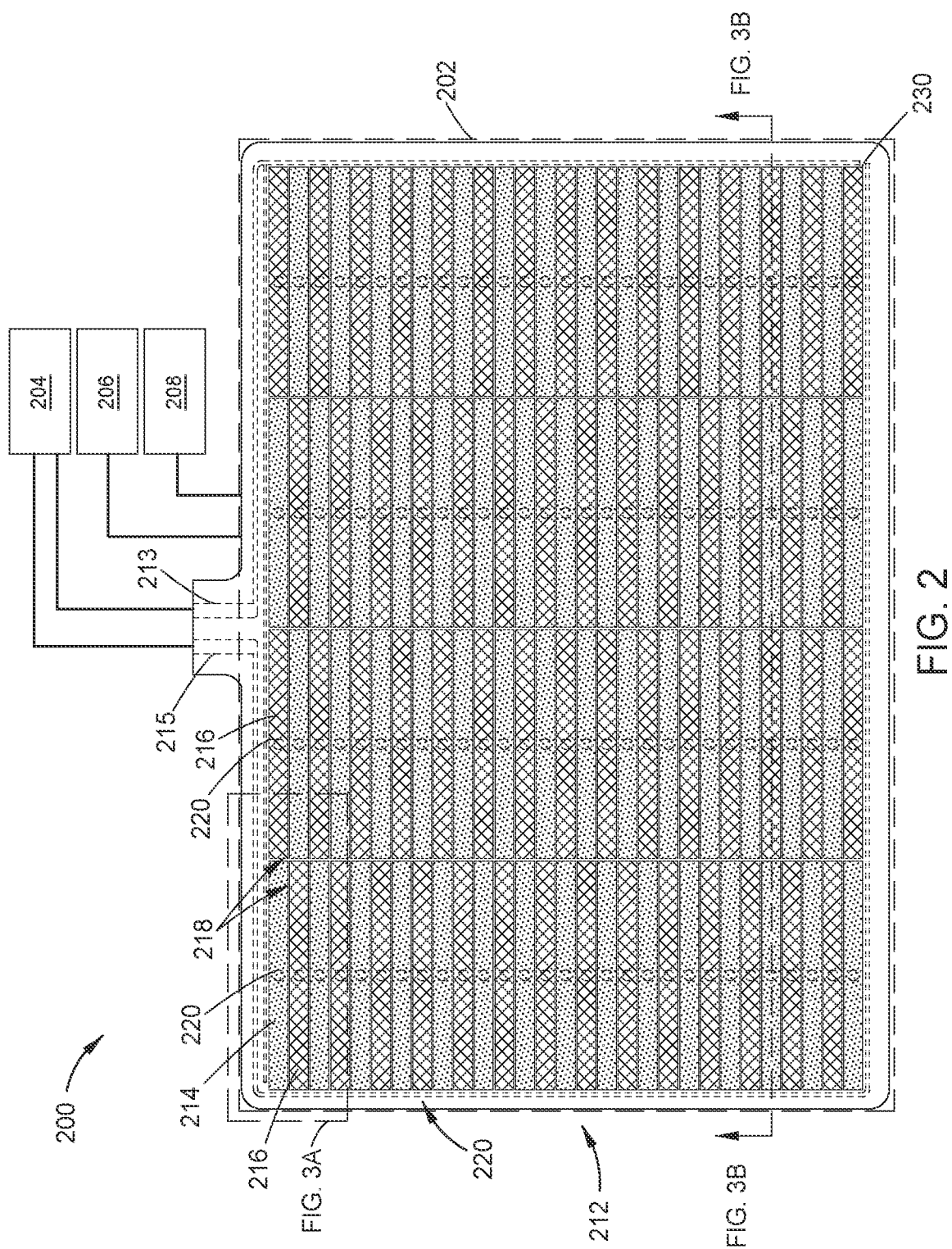

PIXELATED ELECTROSTATIC ADHESION

INTRODUCTION

Field

Aspects of the present disclosure relate to control logic and control circuitry for an electrostatic gripper apparatus. The control methodology described herein can provide one or more of improved grip strength, faster object release from the gripper apparatus, and greater grip discretion between different object compared to other control methodologies.

Background

The movement of objects, such as parts and material, is an important aspect of production and assembly. Conventional systems for moving objects are limited. In particular, there are challenges when moving thin or delicate materials using conventional systems. Keeping with this example, the material may be moved using manual or automated handling. Manual handling is cumbersome and may damage the material. Automated handling includes robotic systems with a vacuum or electrostatic end effectors. Vacuum-based systems require a vacuum be maintained for each area of the material the end effector contacts. Each vacuum that is maintained is limited by an output of a vacuum source, such as a vacuum pump. The vacuum source is very loud and requires a large amount of energy to generate each required vacuum. Further, vacuum-based systems are not suitable for moving delicate material because the vacuum may damage the material by exerting a force on the material that is higher than the force the material can withstand.

Accordingly, there is a need for an improved system for moving objects that can selectively grasp and move the objects without damaging the objects or grasping unwanted nearby objects

SUMMARY

Certain aspects provide a control unit, comprising: a voltage converter configured to increase an input voltage to an output voltage; a first gripping circuit, configured to selectively provide the output voltage at a first polarity to a first subset of electrodes of a plurality of electrodes; a second gripping circuit, configured to selectively provide the output voltage at a second polarity opposite to the first polarity to a second subset of electrodes of a plurality of electrodes that are associated with and different from the first subset of electrodes; a first release circuit, configured to selectively reverse the output voltage provided to the first subset of electrodes to the second polarity; and a second release circuit, configured to selectively reverse the output voltage provided to the second subset of electrodes to the first polarity.

Certain aspects provide an apparatus, comprising: a gripper apparatus, configured to electrostatically grasp an object via a plurality of electrodes; a logic controller, configured to: command the gripper apparatus to grasp the object by: selecting individual electrodes of the plurality of electrodes to grasp the object; activating a first subset of the individual electrodes to carry a voltage at a first duty cycle; activating a second subset of the individual electrodes to carry the voltage at a second duty cycle, different from the first duty cycle; and release the object from the gripper apparatus by: applying the voltage according to a third duty cycle, different from the first duty cycle, to the first subset of the individual electrodes; and applying the voltage according to a fourth duty cycle, different from the second duty cycle, to the second subset of the individual electrodes.

Certain aspects provide a method, comprising: in response to receiving a first command to grasp an object via a gripper apparatus comprising a plurality of electrodes: identifying at least two electrodes of the plurality of electrodes to associate with the object; and activating the at least two identified electrodes for a first subset of the at least two electrodes to carry a voltage at a first polarity and a second subset of the at least two electrodes to carry the voltage at a second polarity opposite to the first polarity; and in response to receiving a second command to release the object from the gripper apparatus, reversing polarities of the voltage in the first subset and the second sub set.

The following description and the related drawings set forth in detail certain illustrative features of one or more embodiments.

DESCRIPTION OF THE DRAWINGS

The appended figures depict certain aspects of the one or more embodiments and are therefore not to be considered limiting of the scope of this disclosure.

FIG. 2 depicts a pixelated electrostatic adhesion system for grasping an object, according to aspects of the present disclosure.

To facilitate understanding, identical reference numerals have been used, where possible, to designate identical elements that are common to the drawings. It is contemplated that elements and features of one embodiment may be beneficially incorporated in other embodiments without further recitation.

DETAILED DESCRIPTION

Figure 1:
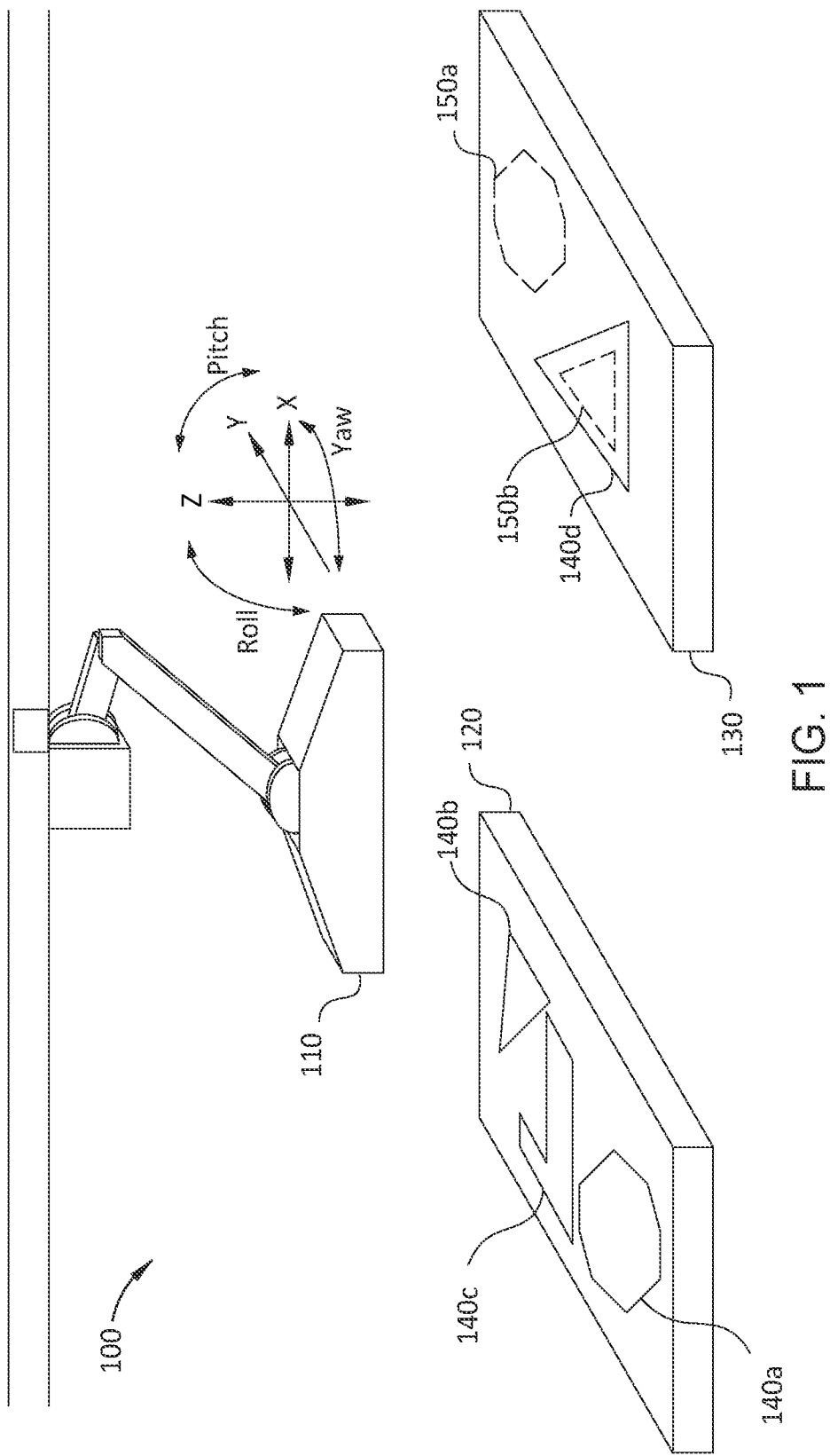
FIG. 1 depicts a gripper apparatus deployed in a manufacturing environment, according to aspects of the present disclosure.

Aspects of the present disclosure provide apparatuses, methods, processing systems, and computer-readable media for controlling an electrostatic gripper apparatus. The controller identifies individually selectable and controllable electrodes in the gripper apparatus to match the shape and location of an item to be picked up by the gripper apparatus. The controller provides these identified electrodes with alternating polarity voltage to electrostatically grip and release the object once moved to a desired location, thereby controlling how the apparatus selectively grasps and moves objects, such as a material or parts, without damaging the objects or grasping unwanted nearby objects.

Typically, objects may be moved using manual or automated handling. For example, pick and place of materials, such as a dry carbon fiber ply, may be done through manual handling. An operator, or multiple operators if the ply is large, will carefully pick up the dry carbon fiber ply from a ply cutter. The ply may be picked out from within a scrap material "skeleton". The operator or operators will then transport the ply to a different location, such as a subsequent tool or a storage location. However, manual handling is a slow process, requires human operators, and can damage the ply as the ply is not handled carefully.

Automated handling may also be used to pick and place a carbon fiber ply. For example, an end effector may be used with a robotic system, such as a gantry or arm. The end effector may include a vacuum system that has discrete vacuum cups in either a grid or an optimized position layout to compliment known ply shapes that will be picked. The robotic system positions the end effector over the ply, turns on the vacuum cups, and picks up and moves the ply. The vacuum system works well for stiffer materials such as dry twills, multiaxials, and prepregs, but may damage more delicate or less stiff materials, such as dry non-crimp fabric (NCF) unidirectional materials. For example, the vacuum system may damage a unidirectional NCF such as a dry carbon fiber ply. Delicate materials require several vacuum cups arranged to compliment the boundary of the ply and to stop the ply edge from folding over or being damaged. Vacuum-based systems have several other drawbacks. The systems are heavy, require a large amount of energy to generate a required vacuum, are difficult to miniaturize to allow discrete control of small areas, can suck up fibers that clog ports within the system, are noisy, and require the vacuum exhaust air to be filtered in controlled contamination area (CCA) rooms.

Another example of automated handling uses an end effector that includes an electrostatic system to pick and place the ply using electrostatic adhesion. Electrostatic-based systems require a high amount of voltage and use a pad and electrostatic energy to "grasp" the material. The electrostatic system includes electrodes as part of the pad to generate an electrostatic field using an alternating open circuit of positive and negative electrode pairs. The electrode pairs are embedded in a dielectric medium or material of the pad and connected to a high voltage power source. Conventional electrostatic systems use a comb-like electrode layout as part of the pad, where the positive and negative electrodes are interdigitated. The power source forms an electrostatic field through the opposing positive and negative charges of the electrode pairs. When the pad is placed near the ply, the electrostatic field temporarily polarizes a corresponding region of the ply at an atomic level and generates an electrostatic force between the ply and the electrode pairs. For example, when the pad is placed near the ply, the charges of various regions of the ply are rearranged (e.g., polarized) such that the positive charges in the ply are attracted to the negative electrode and the negative charges in the ply are attracted to the positive electrode.

Electrostatic systems have several benefits. For example, electrostatic systems are nearly silent, are solid state, require significantly less power than vacuum-based systems, and do not require air filtration. Electrostatic adhesion may be used with conductive and non-conductive materials. Electrostatic systems can further be manufactured using standard printed circuit board (PCB) methods, which beneficially makes them more cost effective when compared to manual handling or vacuum-based systems. However, conventional electrostatic designs have drawbacks. For example, the conventional systems must use the entire pad to pick up the ply, as the pad does not have discrete zones of electrodes that can be turned on and off individually to control the adhesion. Use of the entire pad is problematic when only a portion of a ply must be picked up. For example, a ply cutter may cut the portion of the ply from a ply sheet. Keeping with this example, the cut portion of the ply should be picked up while the scrap material skeleton of the ply sheet should be left behind. However, a conventional system that uses the entire pad to pick up a ply cannot be used to pick up the cut portion of the ply and leave the skeleton when the pad is larger than or extends past a boundary or perimeter of the cut portion of the ply. Further, the conventional systems cannot use multiple pads to create discrete zones because when a pad of the multiple pads is not energized, a large "dead zone" the size of the conventional pad would result. The large dead zone would limit the ability to pick up objects.

Conventional electrostatic systems have additional disadvantages. For example, the conventional systems require significant voltage levels (e.g., about 2,000-4,000V (Volts)) to generate enough electrostatic adhesion to pick up the ply. Conventional electrostatic systems grasp any material that contacts the pad or comes within a set distance from the pad (collectively referred to as contacts the pad). Thus, conventional electrostatic-based systems cannot selectively grasp an object that contacts the pad while not grasping other objects that contact the pad. Additionally, the comb-like layout allows the ply to slide when the robotic system moves, which is undesirable because the sliding may damage the ply or the ply may slide off the electrode pad.

The improved pixelated electrostatic adhesion system, and methods of control thereof, described herein addresses these issues by using discrete zones of electrodes that can be selectively powered or energized. The electrodes of the zones may be variously referred to as electrode pixels, gripping pixels, "gripxels", or gripping electrodes.

As used herein, the terms "grip" and "grasp", unless specified otherwise, refer to the controlled electrostatic adhesion of an object to a gripping surface controlled to produce electrical field (e.g., electrostatic gripping/grasping). When opposing charges are applied by adjacent electrodes of a gripper apparatus, the electrical fields may affect a charge in the surface of the object, thus electrically attracting the object to the electrodes (and optionally an intervening surface between the electrodes and the object).

As used herein, the term "release", unless specified otherwise, refers to the controlled cessation of electrostatic adhesion of the object (e.g., to selectively stop gripping the object). The release of the object may variously include one or more of: removing an electrical field produced by the electrodes, reversing the electrical field produced by the electrodes, amplifying a reversed electrical field produced by the electrodes, and activating a (supplemental) mechanism to physically push the object off of a gripping surface.

In various aspects, the electrodes (and optional intervening surfaces) may be rigidly placed on a pad to grip one surface of an object, while in other aspects, the electrodes (and optional intervening surfaces) may be flexibly or rotatable placed on one or more pads to grip a configurable number of surfaces (or a curved surfaces). The size, shape, layout, and rigidity/flexibility of a given gripper apparatus are generally adapted to the environment in which the gripper apparatus is deployed and the type of objects gripper apparatus is to grasp via electrostatic adhesion; any of which may benefit from the present disclosure. Accordingly, the apparatuses, methods, processing systems, and computer-readable media described in the present disclosure may be applied to various gripper apparatuses adapted to grip various types of objects.

In some aspects, the controller sets a first subset of electrodes to a constant first polarity and a second subset of electrodes a constant second polarity when gripping the object. In such aspects, when releasing the object, the controller reverses the polarity in each of the previously activated electrodes, quickly dropping the object and countering any material charging therein. In other aspects, the controller sets a first subset of electrodes to an alternating first polarity and second polarity and a second subset of electrodes to an alternating second polarity and first polarity (opposite to the first subset) when gripping the object to avoid building up a residual charge in the object. In such aspects, when releasing the object, the controller sets the voltage in each of the previously activated electrodes to a ground voltage, quickly dropping the object without any residual charging therein.

As part of the control logic, an optical sensor can be used to verify that the object has been grasped or released by the gripper apparatus. A solenoid release mechanism or an air blower release mechanism can be used to push the object off of the gripping surface. Additionally, resistive loads in the gripping surface can be controlled to heat the gripping surface to a desired temperature when activated for grasping an object.

Example Operational Environment

FIG. 1 depicts a gripper apparatus 110 deployed in a manufacturing environment 100, according to aspects of the present disclosure. The gripper apparatus 110 is deployed to move objects between a pick-up area 120 and a drop-off area 130. In various aspects, the environment 100 may include one or multiple pick-up areas 120 and one or multiple drop-off areas 130 for a given gripper apparatus 110 and multiple gripper apparatus 110 may be deployed to share one or more pick-up areas 120 or drop-off areas 130. Various other devices may share the manufacturing environment 100 with the gripper apparatus 110, and may be deployed to access one or more of the pick-up area 120 and the drop-off area 130.

The gripper apparatus 110 is an electrostatic gripping device that is provided to move various objects 140a-d (generally or collectively, object 140) from the pick-up area 120 to designated locations 150a-b (generally or collectively, designated location 150) in the drop-off area 130. The gripper apparatus 110 includes a gripping surface (arranged according to one or more of the geometries discussed in greater detail in regard to FIGS. 2-6B) that is selectively controllable to grip and release the different objects 140 in the environment 100. The gripper apparatus 110 may move in the environment 100 with up to six degrees of freedom (e.g., positive or negative X, Y, and Z travel, yaw, pitch, and roll rotation about the X, Y, and Z axes) according to various articulation systems, and move the gripped objects 140 according (e.g., translating and rotating the object 140 from an initial location and orientation to a final location and orientation).

As shown, a first object 140a and a second object 140b are shown in the pick-up area 120, and have corresponding designated locations 150a-b in the drop-off area 130 that the gripper apparatus 110 is signaled to move the respective objects 140 to. In contrasts, an intervening third object 140c is located in the pick-up area 120, but does not have a corresponding designated location 150 in the drop-off area 130, and thus will remain in the pick-up area 120 (at least until after the first object 140a and the second object 140b are moved to the drop-off area 130). In some aspects, one or more of the pick-up area 120 and the drop-off area 130 are electrically grounded (or controllable to be electrically grounded) to reduce electrostatic build up in the objects 140.

In various aspects, the designated locations 150 for drop-off in the drop-off area 130 may change the relative locations of two or more objects 140 selected in the same pick-up action from the pick-up area 120. Additionally, in some aspects, the designated location 150 may overlap one another or objects 140 that have been previously placed in the drop-off area 130 (e.g., the fourth object 140d) to allow the gripper apparatus 110 to layer various objects 140 placed in the drop-off area 130.

The gripping surface of the gripper apparatus 110 offers pixelated control of which sections of the gripping surface are activated (e.g., to grip an object 140) or deactivated (e.g., to release an object 140) at any given time. Accordingly, the gripper apparatus 110 may grip the first object 140a and the second object 140b at first time (and avoid gripping the third object 140c), move the objects 140a-b to the drop-off area 130, orient the first object 140a with the first designated location 150a and release the first object 140a at a second time, and orient the second object 140b with the second designated location 150b and release the second object 140b at a third time. Similarly, the gripper apparatus 110 may grip the first object 140a at a first time (and avoid gripping the second object 140b or the third object 140c), orient and move to grip the second object 140b (and avoid dropping the first object 140a or gripping the third object 140c) in the pick-up area 120, and move to the drop-off area 130 to orient the first object 140a and the second object 140b to the corresponding designated locations 150a-b to release the first object 140a and the second object 140b at a third time. Accordingly, the gripper apparatus 110 can change the relative orientation of two or more objects 140 relative to one another between the pick-up area 120 and the drop-off area 130 without taking multiple trips between the pick-up area 120 and the drop-off area 130. Stated differently, by controlling which portions of the gripping face are activated or deactivated at a given time, fine movement of the relative location of the gripper apparatus 110 in one or more of the pick-up area 120 and drop-off area 130 can reduce the amount of gross movement needed between the pick-up area 120 and the drop-off area 130, thereby saving time and energy during manufacturing processes, and reducing the risk of damage to parts while being manipulated for manufacturing.

Additionally or alternatively to moving the gripper apparatus 110 relative to the pick-up area 120 and the drop-off area 130, the pick-up area 120 and drop-off area 130 may move relative to the gripper apparatus 110 (e.g., via a conveyor belt) to allow the gripper apparatus 110 to select different objects 140 from the pick-up area 120 for movement to the drop-off area 130. One of ordinary skill in the art will be familiar with the various automation systems available for use in the environment 100 to move one or more of the gripper apparatus 110, the pick-up areas 120, and drop-off areas 130 relative to one another, and discussion of such elements is generally omitted from the present disclosure so as not to distract from the control of the pixelated electrostatic adhesion in the gripper apparatus 110 described herein.

By increasing the fine control for selection of various objects by the gripper apparatus 110, the present disclosure may improve the speed of assembly, reduce the power consumption of the gripper apparatus 110 and reduce wear on articulation systems, among other benefits.

Example Pixelated Electrostatic Adhesion System for Grasping an Object

FIG. 2 depicts a pixelated electrostatic adhesion system 200 for grasping an object, according to an example of the present disclosure.

The pixelated electrostatic adhesion system 200 (referred to as the system 200) includes an apparatus, such as a pixelated pad 202, for grasping an object. The pixelated pad 202 is configured to grasp an object electrostatically using a substrate 210. The substrate 210 comprises a plurality of electrode pixels 212. In the depicted aspect, the plurality of electrode pixels 212 includes a plurality of negative electrode pixels 214 (one of which is labeled) and a plurality of positive electrode pixels 216 (two of which are labeled). In this example, each respective electrode pixel of the plurality of electrode pixels 212 is adjacent to at least two other electrode pixels of the plurality of electrode pixels 212. The at least two other electrode pixels have a polarity opposite the respective electrode pixel. For example, a negative electrode pixel 214 is adjacent to at least two positive electrode pixels 216. Thus, the plurality of electrode pixels 212 are arranged in a grid pattern, or a checkerboard pattern, of alternating polarities among adjacent electrode pixels. The grid pattern of the plurality of electrode pixels 212 beneficially allows the system 200 to selectively power or energize discrete zones or subsets of electrode pixels 214 and 216 as described in relation to FIGS. 6A and 6B.

The electrode pixels 214 and 216 shown in FIG. 2 are just one example of how each pixel of the plurality of electrode pixels 212 may be configured. In some aspects, the plurality of electrode pixels 212 may be configured differently such that each pixel of the plurality of electrode pixels 212 may be set to a different polarity than shown in FIG. 2. For example, the polarities of the electrode pixels 212 may be configured to be reversed from what is shown in FIG. 2 such that the electrode pixels shown as the negative electrode pixels 214 may instead be the positive electrode pixels 216 and the electrode pixels 212 shown as the positive electrode pixels 216 may instead be the negative electrode pixels 214. In some aspects, the plurality of electrode pixels 212 may be configured to include only negative electrode pixels or only positive electrode pixels. In some aspects, such as discussed in relation to FIG. 5A, the plurality of electrode pixels 212 may be set such that the electrode pixels 214 and 216 are arranged in a different pattern (e.g., not a checkerboard pattern). In some aspects, the plurality of electrode pixels 212 may be configurable such that each pixel of the plurality of electrode pixels 212 may be set to a positive or negative polarity or grounded (e.g., not powered or energized). For example, the polarity of the electrode pixels 212 may be set to the negative and positive electrode pixels 214 and 216 shown in FIG. 2 to grasp or pick up an object with the pixelated pad 202. When the object is released, the polarities of the plurality of electrode pixels 212 may be reversed to repel the object from the pixelated pad 202. Thus, the discussion of the system 200 in FIG. 2 is not meant to limit the arrangement or configuration of the plurality of electrode pixels 212 to the arrangement shown in FIG. 2.

As shown, the plurality of electrode pixels 212 comprises a rectangular perimeter 230. In some aspects, the perimeter 230 may be a different shape such as a circle, semi-circle, triangle, square, arc, arch, or other polygonal shape as discussed in relation to FIGS. 5B and 5C. Each electrode pixel of the plurality of electrode pixels 212 (referred to as electrode pixels 214 and 216) is separated from any adjacent electrode pixel of the plurality of electrode pixels 212 by a gap 218. For example, the gap 218 separates the negative electrode pixel 214, which is located at a corner of the pixelated pad 202, from the two adjacent positive electrode pixels 216. Keeping with this example, a negative electrode pixel 214 located in the center of the pixelated pad is adjacent to four positive electrode pixels 216. A gap 218 separates the negative electrode pixel 214 from the adjacent positive electrode pixels 216. The grid pattern of the plurality of electrode pixels 212 and the gaps 218 between electrode pixels 214 and 216 provide more opposed electrode pixels (e.g., positive to negative) than conventional electrostatic adhesion systems. For example, a conventional electrostatic adhesion system with two opposed, interdigitated electrodes (e.g., a positive electrode and a negative electrode) with a gap in between. The interdigitated electrodes form opposed electrodes along each interlocked joint.

The system 200 generates an electrostatic field at each set of opposed electrode pixels 214 and 216. When used to pick up an object, each electrostatic field creates an adhesion force by rearranging (e.g., polarizing) charges of the object such that the positive charges in the object are attracted to the negative electrode and the negative charges in the object are attracted to the positive electrode. Thus, the pixelated pad 202 of the system 200 is an improvement over the conventional system with interdigitated electrodes because the improved system 200 has more opposed electrodes, which generate more electrostatic fields than the conventional system, which in turn may increase the adhesion force.

Further, the system 200 is an improvement over the conventional system because the improved system 200 can more reliably pick up objects with anisotropic electrical properties at different alignment angles. For example, the improved system 200 may pick up the anisotropic dry carbon ply when the plurality of electrode pixels 212 are aligned with (e.g., placed at a 0 degree angle from) the length of the strands of carbon of the carbon fiber ply. When aligned, the plurality of electrode pixels 212 create polarized regions along a length of the tows, rather than allowing a current to flow along the conductive length of the strands of carbon. Thus, the improved system 200 can reliably pick up objects with anisotropic electrical properties, regardless of the alignment of the plurality of electrode pixels 212.

A power source (not shown) powers the pixelated pad 202. The power source includes a negative voltage input 213 and a positive voltage input 215. The voltage inputs 213 and 215 are shown as dashed because they are on an opposite side of the substrate 210 than the plurality of electrode pixels 212 and are hidden from view in the perspective of FIG. 2. In some aspects, the substrate 210 may comprise multiple layers. Thus, any reference to the substrate 210 may refer to all layers of the substrate 210 and any reference to a "side" of the substrate 210 is generally made in relation to the substrate as a whole, where one side may be a top or upper layer and another side may be a bottom or lower layer. The negative voltage input 213 connects to the negative electrode pixels 214 and the positive voltage input 215 connects to the positive electrode pixels 216 through a plurality of vias 220 in the substrate 210, as further described in relation to FIGS. 3A-4. The vias 220 are shown as dashed circles on the electrode pixels 212 to illustrate that they are hidden from view in the perspective of FIG. 2.

The system 200 further comprises a controller 204, a motion system 206, and a distance measurement system 208. The controller 204 is configured to energize electrode pixels 214 and 216 individually. For example, the controller 204 may selectively power discrete zones of electrode pixels 214 and 216 or individual electrode pixels as described in relation to FIGS. 6A and 6B. The controller 204 may also power the entire plurality of electrode pixels 212. In some aspects, the controller 204 may selectively energize each pixel of the plurality of electrode pixels 212 as a negative electrode pixel 214, a positive electrode pixel 216, or no polarity (e.g., not powered or energized) as previously discussed.

The motion system 206 is configured to position the substrate adjacent to the object to be grasped. For example, the motion system 206 may include a robotic system, such as a gantry or arm that attaches to the pixelated pad 202 and uses the pixelated pad 202 as an end effecter. The controller 204 may be configured to control movement of the motion system 206.

The distance measurement system 208 is configured to measure a distance between a part of the pixelated pad 202, such as the substrate 210, and the object to be grasped. For example, the distance measurement system 208 may be used to position the substrate 210 a predetermined distance away from the object before the motion system 206 moves the pixelated pad 202 to contact the object. The distance measurement system 208 may be used to determine if the pixelated pad 202 contacts the object before energizing the pixelated pad 202, which beneficially avoids a partial pull up of the object as the motion system 206 moves the pixelated pad 202 into place and prevents damage to the object (e.g., a dry carbon fiber ply). In certain aspects, a part of the pixelated pad 202 may contact the object when the substrate 210 is at the predetermined distance away from the object because the electrode pixels 212 may protrude from the substrate 210. Positioning the pixelated pad 202 before energizing also prevents the system 200 from affecting other objects, such as a scrap material skeleton surrounding a portion of the ply to be picked up that was cut from a ply sheet. The distance measurement system 208 may be further configured to determine an orientation of the pixelated pad 202 in relation to the object. For example, the distance measurement system 208 may determine a shape of the object to be grasped electrostatically.

The distance measurement system 208 may determine how the pixelated pad 202 should be rotated or translated in three-dimensional space to align the pixelated pad 202 to the object based on the shape of the object. Aligning the pixelated pad 202 beneficially allows the pixelated pad 202 to be positioned such that a subset of the plurality of electrode pixels 212 may be energized to selectively pick up the object as described in FIGS. 6A and 6B. The controller 204 may be configured to interface with the distance measurement system 208 and use data (e.g., measurements) received from the distance measurement system 208 to control movement of the motion system 206. The controller 204 may be further configured to energize a subset of electrode pixels of the plurality of electrode pixels 212 based on the shape of the object determined by the distance measurement system 208. For example, the controller 204 may energize the subset of electrode pixels based on a perimeter of the shape of the object. The distance measurement system 208 may include at least one of a laser, ultrasonic, photoelectric, or optical measurement systems. The distance measurement system 208 may also include one of a position sensor such as an encoder or angular sensor to sense a position or angle of the object or the pixelated pad 202. Additional sensors, such as described in relation to FIG. 7, may be used to sense positions or angles.

The different systems and sensors beneficially provide data associated with the position of the pixelated pad 202 in relation to the object. In some aspects, the systems and sensors may be part of another system. For example, the sensors may include encoders that are integrated in a robot arm of the motion system 206.

In some aspects, the substrate 210 is flexible, or includes flexible or articulable portions, which beneficially allows the pixelated pad 202 to conform to a non-planar shape of the object. For example, the substrate 210 may be used to pick up a dry carbon fiber ply from a table with a contour or a piece of carbon fiber that is already formed. The flexible substrate 210 allows the pixelated pad 202 to flex to match the contour of the table, reducing an amount of air gaps between the pixelated pad 202 and the ply. The reduction in air gaps beneficially increases the adhesive force exerted by the pixelated pad 202. In some aspects, the substrate 210 is a printed circuit board (PCB) or a flexible PCB. In some aspects, the plurality of electrode pixels 212 may be secured to substrate 210 through various means including adhesive or solder, or may be formed as a layer of the substrate 210.

Examples of Pixelated Pads for Grasping an Object

Figure 3A:
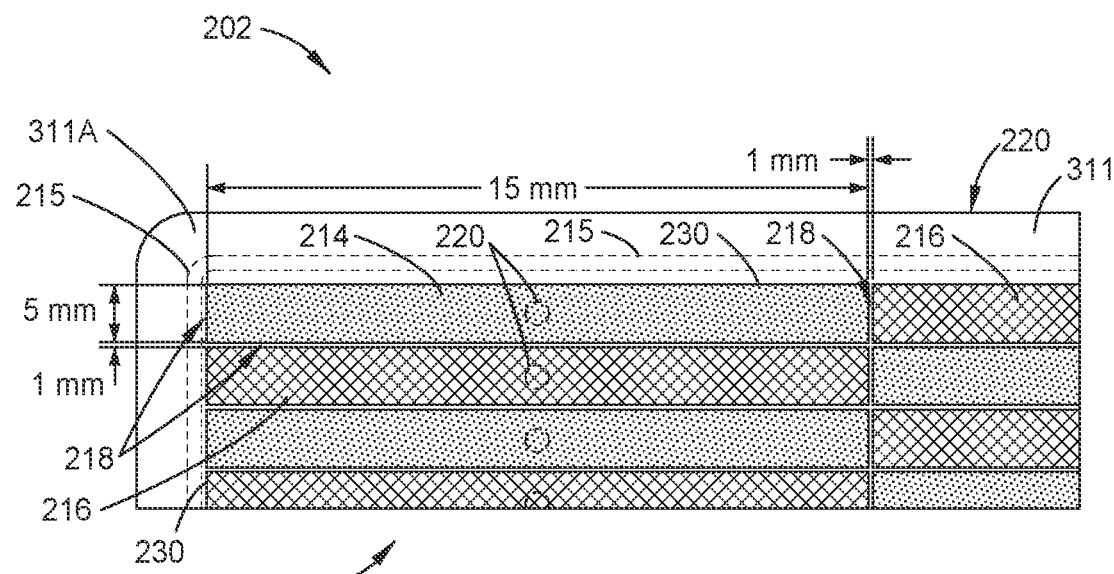
FIG. 3A depicts a partial top plan view the pixelated electrostatic adhesion system from FIG. 1, according to aspects of the present disclosure.

FIG. 3A depicts a partial top plan view of the pixelated electrostatic adhesion system 200, according to another example of the present disclosure. In particular, FIG. 3A shows a close up of the plurality of electrode pixels 212 and the gap 218 between the electrode pixels 214 and 216.

Figure 3B:
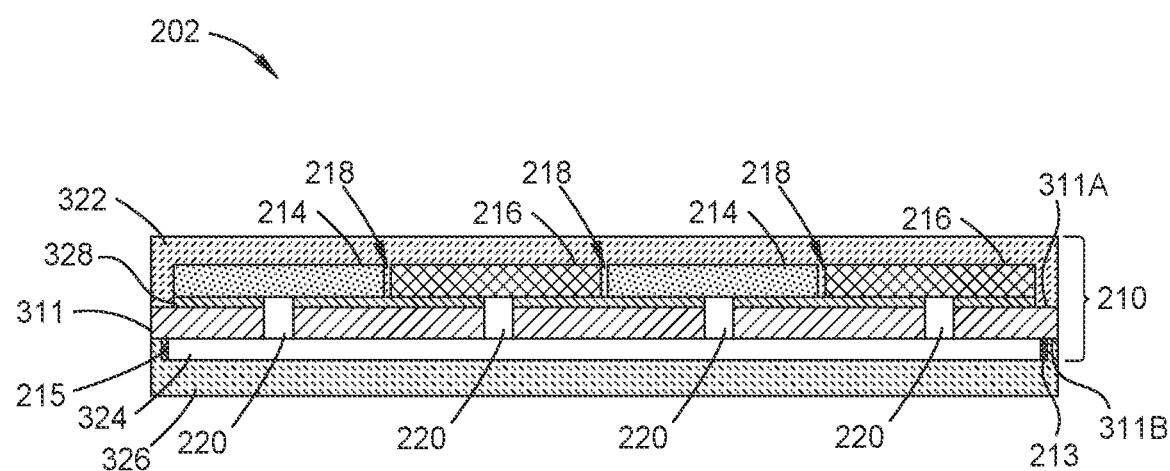
FIG. 3B depicts a side cross-sectional view of the pixelated electrostatic adhesion system from FIG. 2, according to aspects of the present disclosure.

The plurality of electrode pixels 212 are arranged on an upper side of the substrate 210, where "upper" is in relation to the orientation shown on the page in FIG. 3B. For example, the plurality of electrode pixels 212 are arranged on a first side 311A of a core layer 311 of the substrate 210. The core layer 311 is further discussed in FIG. 3B. The electrode pixels 214 and 216 may vary in size or shape. In the depicted aspect, the electrode pixels 214 and 216 are rectangular in shape and measure approximately 5 mm (millimeters)×50 mm in size. In some aspects, the electrode pixels 214 and 216 may be 5 mm×15 mm. In some aspects, different dimensions may be used for the electrode pixels 214 and 216. In relation to the measurements of the shape of the electrode pixels 214 and 216, "approximately" may mean within plus or minus 1 mm. In other aspects, the electrode pixels 214 and 216 may be a different shape, such as discussed in relation to FIGS. 2, 5B, and 5C. The size of the gap 218 in the depicted aspect is generally no more than approximately 1 mm, although other gap sizes may be used in some aspects. Generally speaking, as the size of the gap 218 decreases, the resulting adhesion force increases. Thus, a gap size of approximately 1 mm or less beneficially increases the adhesion force of the pixelated pad 202 when compared to larger gap sizes used in conventional electrostatic adhesion systems. In relation to the size of the gap 218, "approximately" may mean within plus or minus 20 percent. In some aspects, the size of the gap 218 may be no more than approximately 2 mm. The vias 220 are shown as dashed circles on the plurality of electrode pixels 214 and 216 to illustrate that they are hidden from view in the perspective of FIG. 3A (such as shown in FIG. 3B). In some aspects, the vias 220 may be positioned at another location, such as at an edge of each electrode pixel 214 and 216. In some aspects, the vias 220 may extend through the electrode pixels 214 and 216 as through holes.

FIG. 3B depicts a side cross-sectional view of the pixelated electrostatic adhesion system 200, according to another example of the present disclosure. In particular, FIG. 3B shows different layers of the pixelated pad 202.

As previously discussed, the plurality of electrode pixels 212 (e.g., electrode pixels 214 and 216) are arranged on a first side 311A of the core layer 311 of the substrate 210. The core layer 311 may function as a bonding layer, insulating layer, or structural support layer for the substrate 210. In some aspects, the core layer 311 may comprise a dielectric medium such as at least one of glass or polymers such as polytetrafluoroethylene (PTFE), polypropylene, and polyethylene and the like. For example, the core layer 311 may be an acrylic wafer.

A dielectric layer 322 is disposed over the electrode pixels 214 and 216 such that the dielectric layer 322 is positioned in between the electrode pixels 214 and 216 and the object to be grasped. The dielectric layer 322 may be thin enough such that the dielectric layer 322 does not reduce the electrostatic field of the electrode pixels 214 and 216. The thickness of the dielectric layer 322 may vary depending on the dielectric medium. Further, the dielectric layer 322 comprises a dielectric medium or material, such as previously discussed, and may be disposed in the gaps 218. In some aspects, the dielectric layer 322 comprises a different dielectric medium than the core layer 311. In some aspects, the dielectric layer 322 comprises polyimide or a fiberglass prepreg. In some aspects, the dielectric layer 322 is air surrounding the electrode pixels (e.g., ambient air) and is not actually a contained layer, which beneficially allows bare electrode pixels 214 and 216 to be used to grasp nonconductive materials.

As shown in FIG. 3B, a plurality of conductive control traces 324 are arranged on a different layer than the electrode pixels 214 and 216. The plurality of conductive control traces 324 may be arranged on a lower side of the substrate 210, where "lower" is in relation to the orientation shown on the page in FIG. 3B. For example, the plurality of conductive control traces 324 may be arranged on a second side 311B of the core layer 311 of the substrate 210, where the second side 311B is an opposite side of the core layer 311 than the first side 311A. Each of the electrode pixels 214 and 216 is connected to a conductive control trace of the plurality of conductive control traces 324 by a via 220 in the substrate 210. As shown in FIG. 3B, the voltage inputs 213 and 215 are positioned on the second side 311B of the core layer 311 and connect to the conductive control traces 324.

In some aspects, the voltage inputs 213 and 215 and/or the conductive control traces 324 are positioned at a different location or locations. For example, the substrate 210 may comprise a plurality of layers. The voltage inputs 213 and 215 and the conductive control traces 324 may each be positioned on a different layer or in between two different layers of the plurality of layers of the substrate 210. The negative voltage inputs 213 and the positive voltage inputs 215 may be positioned such that the voltage inputs 213 and 215 are not positioned on or in between the same layer of the substrate 210. The conductive control traces 324 may also be positioned such that different conductive control traces of the conductive control traces 324 are not positioned on or in between the same layer. Thus, the voltage inputs 213 and 215 and the conductive control traces 324 may be split between the layers. In some aspects, the vias 220 may not form a through hole through all the layers of the substrate and may instead form an opening through some of the layers of the substrate.

In some aspects, the voltage inputs 213 and 215 may connect to the electrode pixels 214 and 216 by a PCB that is separate from the substrate 210. For example, a PCB may include the voltage inputs 213 and 215 and the plurality of conductive control traces 324, each of the vias 220 of the substrate 210 may terminate in a socket or a pin, and the PCB may be configured to connect the conductive control traces 324 to the sockets or pins of the vias 220. The PCB may allow the conductive control traces 324 to be reconfigured by a removable PCB. The removable PCB beneficially allows the voltage inputs 213 and 215 to supply the electrode pixels 214 and 216 through different configurations. By way of example, one configuration may supply a voltage input 213 or 215 to each electrode pixel of the electrode pixels 214 and 216. Another configuration may supply a voltage input 213 or 215 to different regions or zones of the electrode pixels 214 and 216. In some aspects, the controller may be coupled to the removable PCB and configured to supply the voltage inputs 213 and 215 to the electrode pixels 214 and 216.

In one example, each electrode pixel of the plurality of electrode pixels 212 is configured to be energized in a range of magnitudes of voltages between 0V (Volts) and 4,000V. In another example, each electrode pixel of the plurality of electrode pixels 212 is configured to be energized in a range of magnitudes of voltages between 0V and 1,500V. In some aspects, other magnitudes of voltages may be used to energize the plurality of electrode pixels 212. The voltage inputs 213 and 215 may be controlled by the controller 204, as discussed in relation to FIGS. 2 and 7, or a controller connected to the power source. The conductive control traces are further discussed in relation to FIG. 4.

The pixelated pad 202 may include at least one heating element 328. The at least one heating element 328 is configured to heat the dielectric layer 322, which beneficially increases the adhesion force as observed in experiments. The heating element 328 is shown as located between the electrode pixels 214 and 216 and the core layer 311 and is configured to heat the dielectric layer 322 through the electrode pixels 214 and 216 by conduction. The vias 220 may further extend through the at least one heating element 328 and the at least one heating element 328 may connect to a conductive control trace of the conductive control traces 324 through one or more of the vias 220. In some aspects, the heating element 328 may be configured to heat discrete zones of electrode pixels 214 and 216, individual electrode pixels, or the entire plurality of electrode pixels 212. For example, the heating element 328 may comprise a plurality of heating elements 328 and each heating element of the plurality of heating elements 328 may correspond to and may be placed behind a zone or a region of the electrode pixels 214 and 216. Each heating element of the plurality of heating elements 328 may also be placed behind an individual electrode pixel of the electrode pixels 214 and 216 and/or in the gaps 218. In some aspects, the heating element 328 may be located between different layers of the pixelated pad 202 than shown in FIG. 3B. In some aspects, the heating element 328 may not be located in between the electrode pixels 214 and 216 and the object to be grasped.

In some aspects, such as aspects where the substrate 210 comprises a plurality of layers (referred to as a multi-layer substrate), the dielectric layer 322, the electrode pixels 214 and 216, the gaps 218, the at least one heating element 328, the core layer 311, the voltage inputs 213 and 215, and the conductive control traces 324 may each form at least one layer of the plurality of layers of the substrate 210. For example, the electrode pixels 214 and 216 and the gaps 218 may form at least one layer of the substrate 210. The conductive control traces 324 may form a different layer of the substrate 210. The vias 220 may connect the conductive control traces 324 to the electrode pixels 214 and 216 by through-hole vias, blind vias, and/or buried vias. In some aspects, the multi-layer substrate may include at least one prepreg layer that may bind together different layers of the multi-layer substrate. The core layer 311 may also include one or more prepreg layers. In some aspects, the multi-layer substrate comprises dielectric layers between each layer containing the electrode pixels 214 and/or 216. The dielectric layers protect each conductive layer containing the electrode pixels 214 and 216 from arcing to another conductive layer. In some aspects, the multi-layer substrate may only comprise dielectric layers and electrode pixel layers. For example, the layers of the multi-layer substrate may be arranged as dielectric-electrode pixel-dielectric-electrode pixel-dielectric and so forth. The dielectric-electrode pixel multi-layer substrate may further interface with a removable PCB configured to supply the voltage inputs 213 and 215 to the electrode pixels by the vias as previously discussed.

Figure 7:
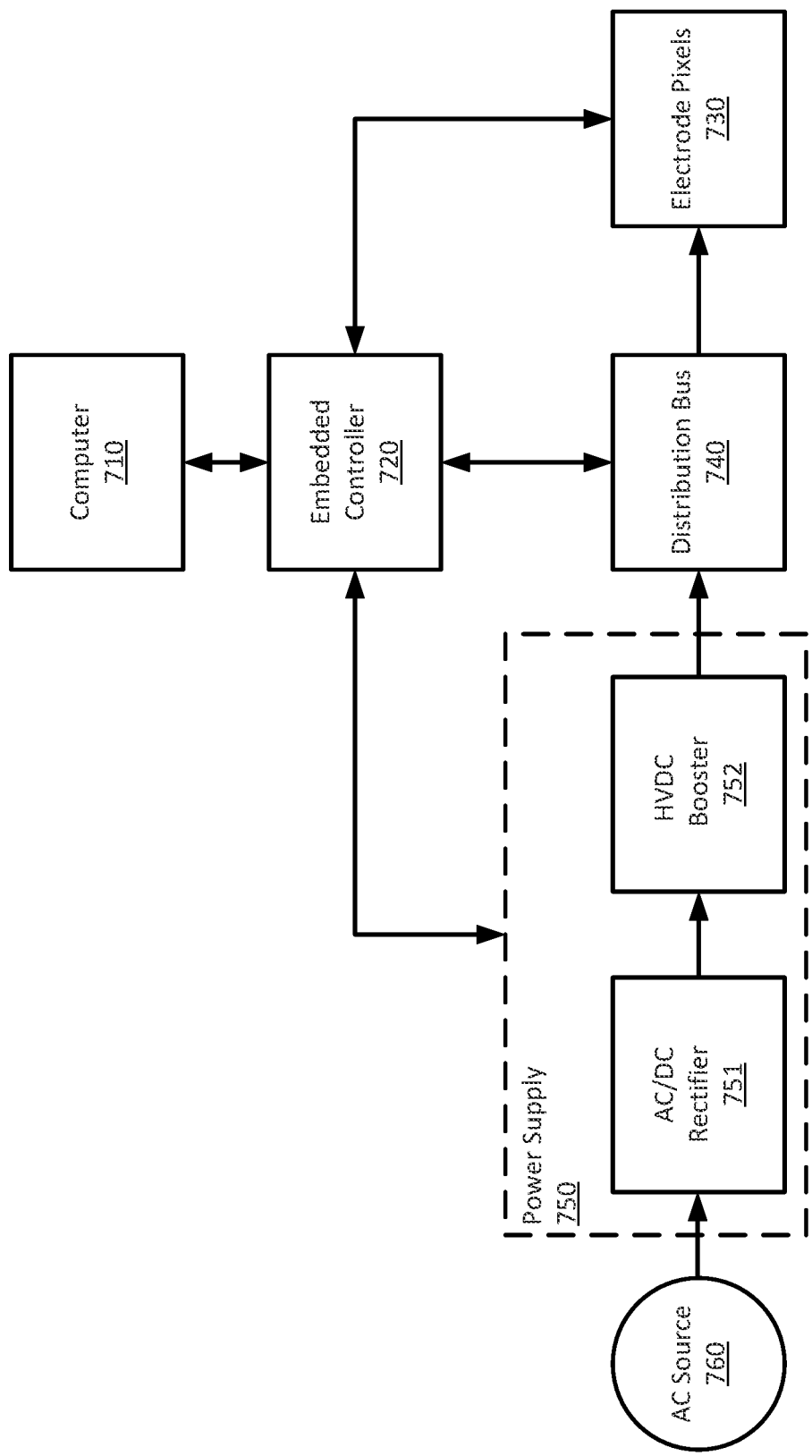
FIG. 7 is a block diagram of a control architecture for a gripper apparatus, according to aspects of the present disclosure.

Some aspects further include a temperature sensor, such as a thermocouple, to sense a temperature of the heating element 328 or of another part of the pixelated pad 202, as discussed in relation to FIG. 7. The temperature sensor may be part of the heating element 328 or may be mounted to the heating element 328. The temperature sensor may also be mounted to the substrate 210 or one or more of the electrode pixels 214 and 216. The temperature sensor beneficially allows the temperature of the heating element 328, the substrate 210, and/or the electrode pixels 214 and 216 to be regulated by controlling power to the heating element 328.

In some aspects, a controller, such as the controller 204 discussed in relation to FIGS. 2 and 7, is configured to control the heating element 328. For example, the controller may be configured to energize the heating element 328 and configured to regulate a temperature of the dielectric layer 322 by energizing, via the controller, at least one heating element 328 configured to heat the dielectric layer 322. The heating element 328 may require less voltage or power than the plurality of electrode pixels 212. In some aspects, the temperature sensor may interface with the controller to regulate the temperature of the dielectric layer 322. For example, the system controller may regulate the temperature of the dielectric layer 322 by controlling the heat outputted by the heating element 328 using data from the temperature sensor. Data from the temperature sensor can be used to form a control feedback loop, such as may be implemented by the control system of FIG. 7. In some aspects, a plurality of heating elements 328 may be configured to heat different zones or regions of the dielectric layer 322. Each heating element of the plurality of heating elements 328 may be selectively energized via the controller. For example, each heating element may interface with a corresponding temperature sensor and the controller may independently control the heat outputted by each heating element using data from the temperature sensor. In some aspects, the zones or regions of the dielectric layer 322 heated by the plurality of heating elements 328 may coincide with the zones or regions of the electrode pixels 214 and 216.

The pixelated pad 202 may include a flexible support layer 326 in contact with the substrate 210. The flexible support layer 326 is configured to allow the pixelated pad 202 to conform to a surface of the object to be grasped, as described above. For example, the pixelated pad 202 may be used to pick up a dry carbon fiber ply from a table or a piece of carbon fiber that is already formed. A surface of the table that the ply rests on or of the formed piece of carbon fiber may not be flat and so the ply or piece may not be flat when it is picked up. The flexible support layer 326 allows the pixelated pad 202 to flex to match a contour of the table, reducing an amount of air gaps between the pixelated pad 202 and the ply. The reduction in air gaps beneficially increases the adhesive force exerted by the pixelated pad 202. As shown, the flexible support layer 326 is attached to the second side 311B of the core layer 311 and at least partially surrounds the voltage inputs 213 and 215 and the conductive control traces 324, beneficially preventing the voltage inputs 213 and 215 and the conductive control traces 324 from contacting items external to the pixelated pad 202 during use. In some aspects, the flexible support layer 326 may be a layer of the substrate 210. For example, the core layer 311 may comprise a flexible material and function as the flexible support layer 326.

Figure 4:
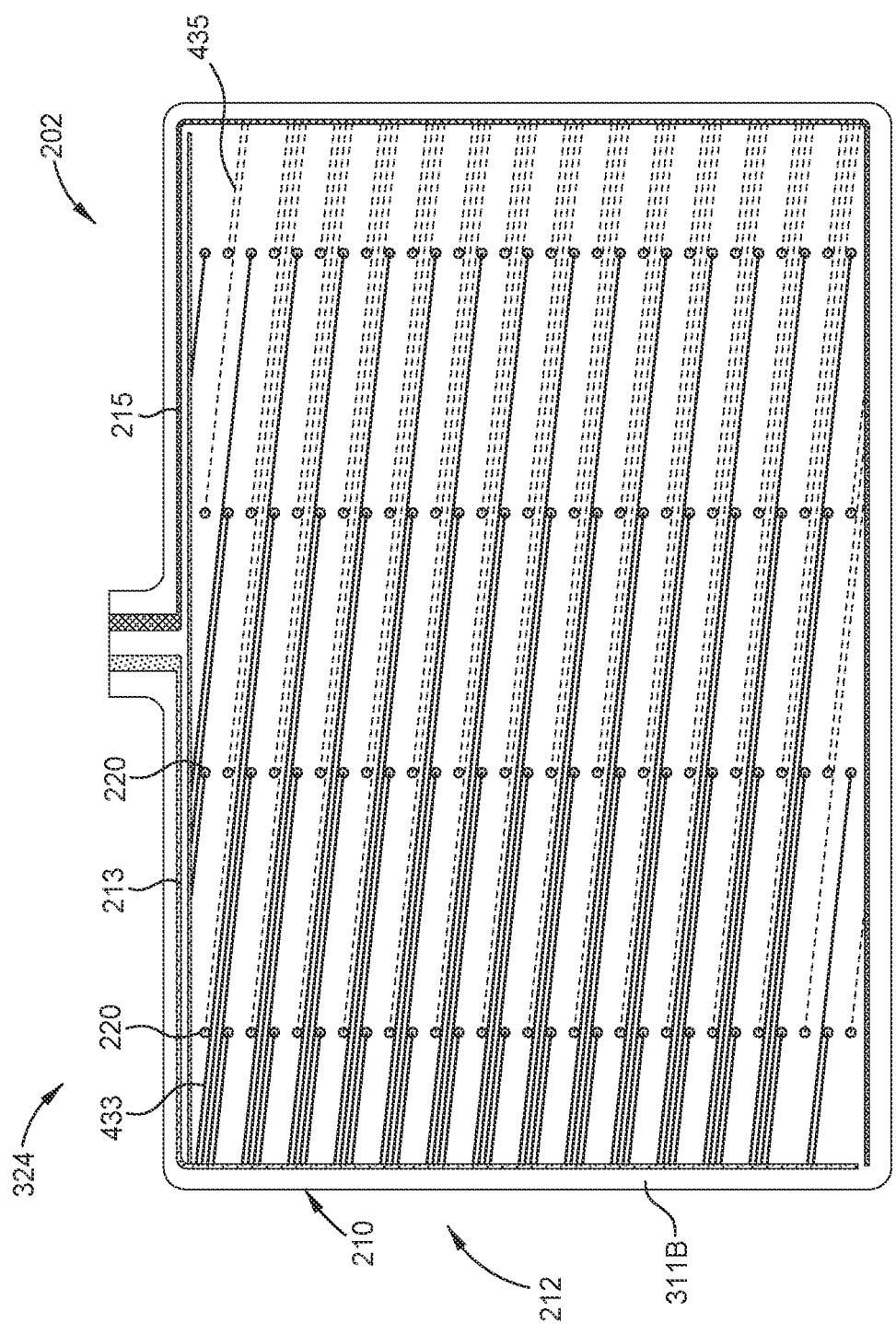
FIG. 4 depicts a wiring layout in a rear view of a pixelated electrostatic adhesion system for grasping an object, according to aspects of the present disclosure.

FIG. 4 depicts a wiring diagram in a rear view of the pixelated electrostatic adhesion system 200, according to another example of the present disclosure. In particular, FIG. 4 shows an example of how the conductive control traces 324 may connect to the electrode pixels 214 and 216 of the pixelated pad 202. In various aspects, the power and control wiring can come into the pixelated pad 202 via connectors mounted directly to the back (e.g., the side opposite to the gripping surface) of the pad.

As shown in FIG. 4, the voltage inputs 213 and 215 are disposed along the perimeter 230 of the plurality of electrode pixels 212. The voltage inputs 213 and 215 connect to the conductive control traces 324, which as shown include negative control traces 433 and positive control traces 435. For example, the negative voltage input 213 connects to negative control traces 433 and the positive voltage input 215 connects to the positive control traces 435. The conductive control traces 324 further connect to the plurality of electrode pixels 212 as discussed in relation to FIG. 3B. In the depicted aspect, each of the negative electrode pixels 214 connects to a negative control trace 433 and each of the positive electrode pixels 216 connects to a positive control trace 435. The individualized connection of the conductive control traces 324 to the plurality of electrode pixels 212 allows each of the electrode pixels 214 and 216 to be energized individually. Each of the electrode pixels 214 and 216 may be configured to be energized in a range of magnitudes of voltages between 0V and 4,000V. Thus, the negative voltage input 213 may be configured to supply a voltage between −0V and −4,000V and the positive voltage input 215 may be configured to supply a voltage between 0V and 4,000V. In some aspects, the range of magnitudes of voltages may be between 0V and 1,500V.

As shown in FIG. 4, the conductive control traces 324 follow an interlocked layout, such as a diagonal layout. The interlocked layout beneficially allows the conductive control traces 324 to be arranged on a single layer and to connect to each of the plurality of electrode pixels 212 without overlapping or interfering with other conductive control traces. For example, the interlocked layout of the negative and positive control traces 433 and 435, respectively, allows each of the control traces 433 and 435 to be arranged on the second side 311B of the core layer 311 and connect to each of the electrode pixels 214 and 216, respectively, while maintaining a minimum separation distance from the other conductive control traces. In some aspects, a layout or pattern other than a diagonal layout may be used for the conductive control traces 324, such as freeform or curved shapes.

In some aspects, the conductive control traces 324 may be wires. In some aspects, the conductive control traces 324 may be tracks or circuit traces of a printed circuit board as previously discussed in relation to FIG. 3B. In some aspects, the conductive control traces 324 may comprise several layers of the substrate 210 as previously discussed in relation to FIG. 3B, which beneficially allows the conductive control traces 324 to connect to the electrode pixels 212 without overlapping or interfering with other conductive control traces. In some aspects, the control traces 433 and 435 may connect to different zones or regions of electrode pixels 214 and 216 instead of individual electrode pixels.

Although the voltage inputs 213 and 215 are each shown as a single line, the voltage inputs 213 and 215 may each comprise a plurality of wires or circuit traces. For example, there may be one negative voltage input 213 for each negative control trace 433 and one positive voltage input 215 for each positive control trace 435.

Figure 5A:
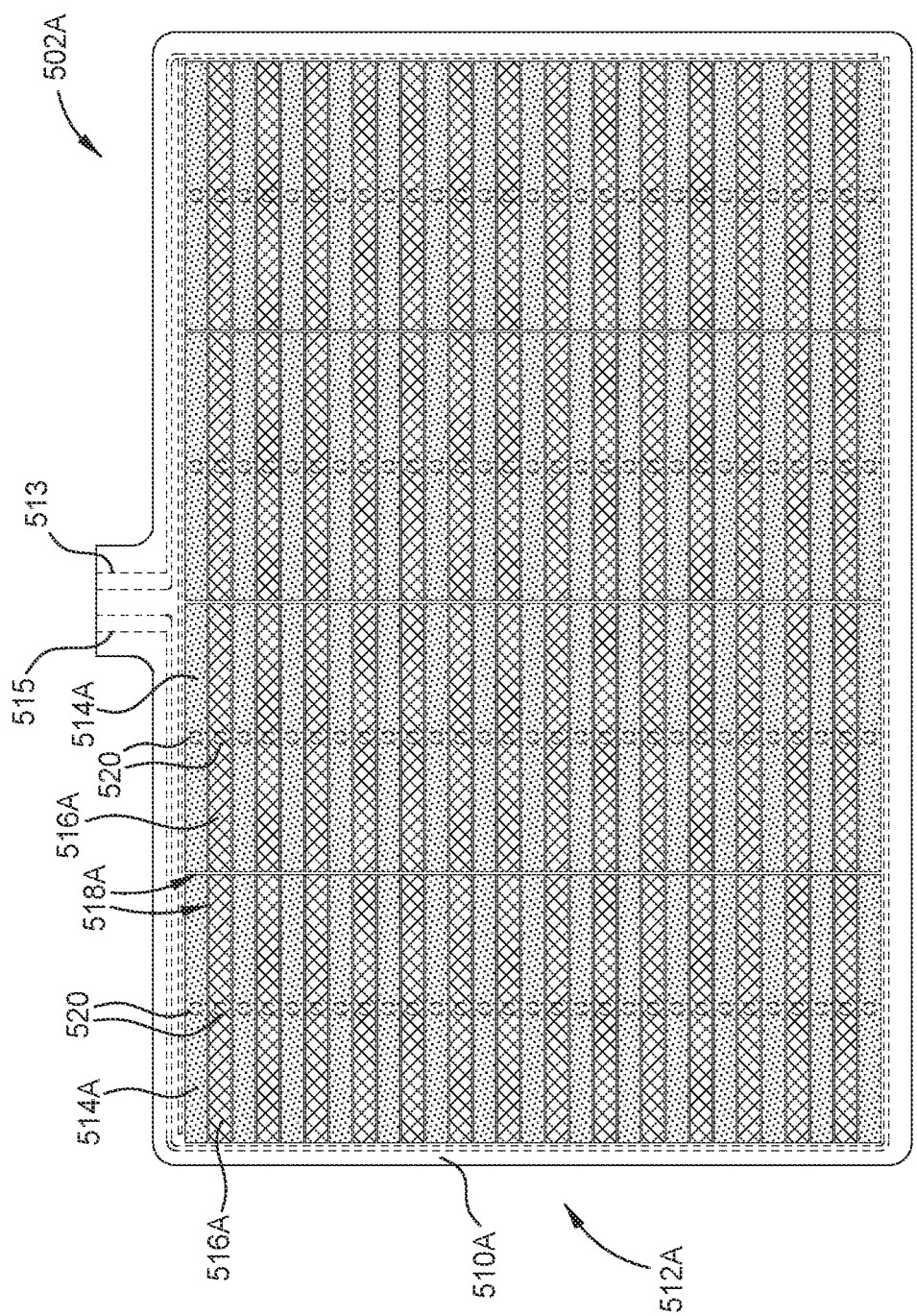
FIGS. 5A-5C depict different pixelated electrostatic adhesion systems for grasping an object, according to aspects of the present disclosure.

In some aspects, the voltage inputs 213 and 215 may each comprise a single wire or circuit trace. For example, a controller, a power distribution module, in-line switching elements, or a distribution board (collectively referred to as a control trace power supply) may be disposed in between the voltage inputs 213 and 215 and the conductive control traces 324. The control trace power supply may be configured to selectively energize each conductive control trace of the conductive control traces 324, and thus selectively energize one or more of the electrode pixels 214 and 216 connected to each conductive control trace 324. The control trace power supply may further be configured to energize each electrode pixel of the plurality of electrode pixels 212 with a range of magnitudes of voltages between 0V and 4,000V. In some aspects, each electrode pixel of the plurality of electrode pixels 212 may be independently energized to a different voltage than other electrode pixels in the plurality of electrode pixels 212. In some aspects, the controller 204, as discussed in relation to FIG. 2, may include the control trace power supply, and thus the controller 204 is configured to selectively energize each conductive control trace of the conductive control traces 324. For example, the controller 204 may energize each conductive control trace of the conductive control traces 324 with a positive or negative voltage, and may change between positive and negative voltages as needed. Thus, the configuration of the electrode pixels 214 and 216 may be reconfigured on-demand to be different than shown in FIGS. 2-4, such as shown in FIG. 5A.

In some aspects, the voltage inputs 213 and 215 may be configured differently. For example, the voltage inputs 213 and 215 may not be disposed along the perimeter 230 and may be inside the perimeter 230. In some aspects, the voltage inputs 213 and 215 may be located on the first side 311A of the core layer 311. For example, the voltage inputs 213 and 215 may connect to each of the control traces 433 and 435 through vias (not shown).

The discussion in relation to FIGS. 2-4 present different aspects of the system 200 and the pixelated pad 202. In some aspects, such as discussed in relation to FIGS. 5A-5C, different pixelated pads may be used with the system 200 or similar pixelated electrostatic adhesion systems.

Examples of Different Pixelated Pads

Figure 5B:
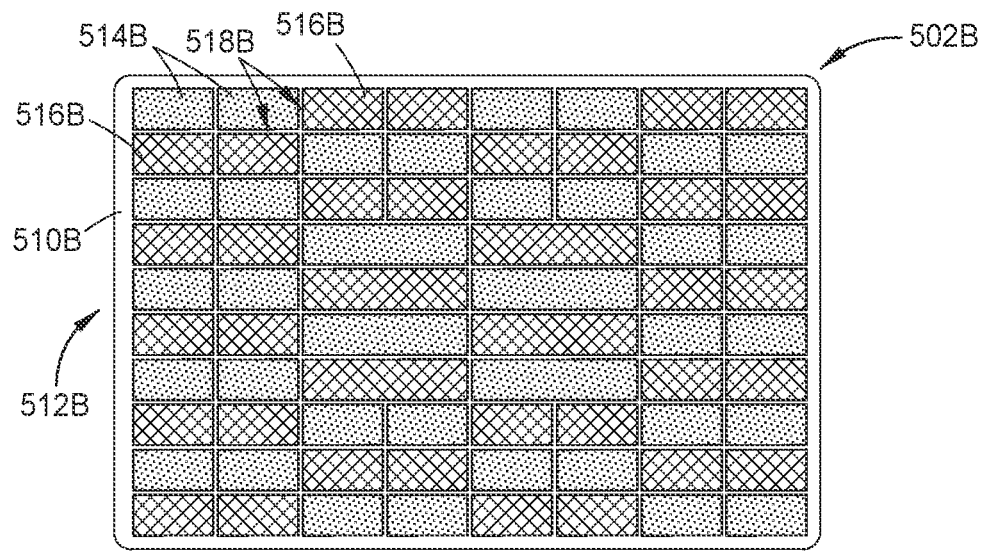
Figure 5C:
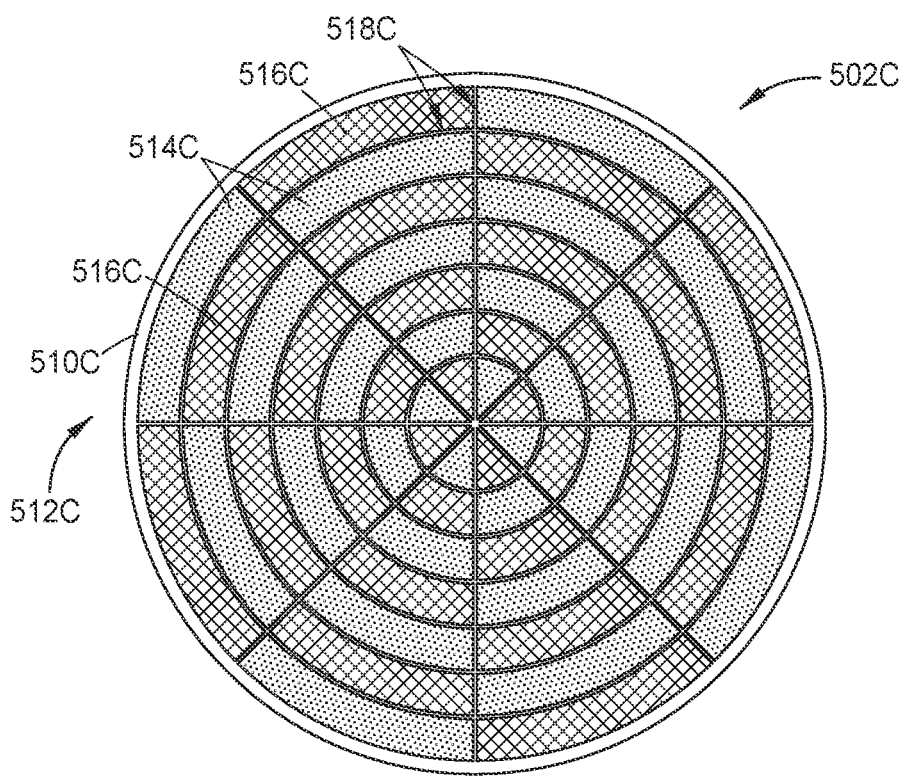

FIGS. 5A-5C depict different pixelated electrostatic adhesion systems for grasping an object, according to an example of the present disclosure. In particular, FIGS. 5A-5C show examples of different electrode layouts of different pixelated pads 502A-C.

FIG. 5A depicts a different pixelated pad 502A for grasping an object, according to an example of the present disclosure. In particular, the pixelated pad 502A shown in FIG. 5A is an improved version of the comb-like electrode layout of the conventional interdigitated systems.

The pixelated pad 502A includes a substrate 510A, which further includes a plurality of electrode pixels 512A. The plurality of electrode pixels 512A are arranged in a grid pattern such that each respective electrode pixel of the plurality of electrode pixels 512A is adjacent to at least two other electrode pixels of the plurality of electrode pixels 512A. A plurality of gaps 518A separates each electrode pixel of the plurality of electrode pixels 512A. In the depicted aspect, the plurality of electrode pixels 512A includes a plurality of negative electrode pixels 514A (two of which are labeled) and a plurality of positive electrode pixels 516A (two of which are labeled). The negative and positive electrode pixels 514A and 516A, respectively, are arranged in an interdigitated pattern such that each row of the plurality of electrode pixels 512A alternates. For example, a first row may include only negative electrode pixels 514A, a second row may include only positive electrode pixels 516A, a third row may include only negative electrode pixels 514A, a fourth row may include only positive electrode pixels 516A, and so forth. Each row of the plurality of electrode pixels 512A may include more than one electrode pixel. For example, in the depicted aspect, each row includes four electrode pixels 514A or 516A. The more than one electrode pixels per each row allows portions of each row to be energized, which beneficially allows the pixelated pad 502 to selectively grasp objects as described in relation to FIGS. 6A and 6B. For example, conventional systems use a conventional electroadhesive pad that non-selectively grasps all objects that contact the conventional electroadhesive pad or come within a set distance from the pad.

The negative electrode pixels 514 are connected to a negative voltage input 513 through negative control traces (not shown). Similarly, the positive electrode pixels 516 are connected to a positive voltage input 515 through positive control traces (not shown). The negative and positive control traces (referred to as conductive control traces) connect to the negative and positive electrode pixels 514 and 516, respectively, through a plurality of vias 520 (four of which are labeled) in the substrate 510 as described in relation to FIGS. 3A-4. The plurality of vias 520 are shown as dashed circles on the plurality of electrode pixels 512 to illustrate that they are hidden from view in the perspective of FIG. 5A.

In some aspects, the negative and positive electrode pixels 514A and 516A, respectively, may be reconfigured as discussed on relation to FIG. 4 such that they match the pattern of the electrode pixels 214 and 216 shown in FIG. 2.

In some aspects, the plurality of electrode pixels 512 may include more or fewer rows or columns. In some aspects, each row of the plurality of electrode pixels 512 may include negative and positive electrode pixels. In some aspects, more or fewer electrode pixels may be used per the rows.

FIG. 5B depicts a different pixelated pad 502B for grasping an object, according to an example of the present disclosure. In particular, the pixelated pad 502B shown in FIG. 5B is similar to the pixelated pad 202 of the system 200 discussed in relation to FIG. 2, except for a layout of a plurality of electrode pixels 512B.

The pixelated pad 502B includes a substrate 510B that further includes the plurality of electrode pixels 512B. The plurality of electrode pixels 512B comprises negative electrode pixels 514B and positive electrode pixels 516B as shown in one example configuration. The negative and positive electrode pixels 514B and 516B, respectively, may be reconfigured as discussed on relation to FIG. 4. A plurality of gaps 518B separate the electrode pixels 514B and 516B.

As shown in the depicted aspect, each row may have a different amount of electrode pixels. For example, outer portions of the pixelated pad 502B may include more electrode pixels than an inner portion or a center portion. The varying amount of electrode pixels per row beneficially allows the pixelated pad 502 to selectively grasp objects with different or complex borders with finer control than a pixelated pad having a constant amount of electrode pixels per row. For example, the electrode pixels of the outer portion of the pixelated pad 502B may be selectively energized to match a shape of an object to be grasped as described in relation to FIGS. 6A and 6B.

In some aspects, the pixelated pad 502B may further include a plurality of vias, positive and negative voltage inputs, and conductive control traces as discussed in relation to FIGS. 2-4.

FIG. 5C depicts a different pixelated pad 502C for grasping an object, according to an example of the present disclosure. In particular, the pixelated pad 502C shown in FIG. 5C is similar to the pixelated pad 502B discussed in relation to FIG. 5B, except for a shape of a substrate 510C and a shape and a layout of a plurality of electrode pixels 512C.

Similar to the pixelated pad 502B, the pixelated pad 502C includes the substrate 510C and a plurality of electrode pixels 512C comprising negative electrode pixels 514C and positive electrode pixels 516C that are separated by a plurality of gaps 518C. The plurality of electrode pixels 512C are arranged in a circular pattern (also referred to as a target pattern) having a plurality of nested rings of electrode pixels. As shown, each respective electrode pixel of the plurality of electrode pixels 512C has an arc, arch, or semi-circular shape and is adjacent to at least two other electrode pixels of the opposite polarity. For example, the negative electrode pixel 514C is adjacent to at least two positive electrode pixels 516C. In the depicted aspect, the electrode pixels in each ring of the circular pattern alternate between the negative electrode pixels 514C and the positive electrode pixels 516C. The electrode pixels further alternate between the negative and the positive electrode pixels 514C and 516C, respectively, in a radially outward direction from a center ring to an outer ring of the circular pattern. The electrode pixels 514C and 516C vary in shape and size. Each electrode of the plurality of electrode pixels 512C may be selectively energized, which beneficially allows the pixelated pad 502C to selectively grasp objects as described in relation to FIGS. 6A and 6B. The negative and positive electrode pixels 514C and 516C, respectively, may be reconfigured as discussed on relation to FIG. 4.

In some aspects, each ring of the circular pattern contains only negative electrode pixels 514C or only positive electrode pixels 516C. In some aspects, the plurality of electrode pixels 512C may be arranged in a spiral pattern. In some aspects, the circular pattern may be considered a grid pattern.

In some aspects, the pixelated pad 502C may further include a plurality of vias, positive and negative voltage inputs, and conductive control traces as discussed in relation to FIG. 5A.

FIGS. 5A-5C present different aspects of a pixelated pad. For example, the pixelated pads 502A-402C each differ from the pixelated pad 202 previously discussed in relation to FIGS. 2-4. In some aspects, each of the pixelated pads 502A-402C may be used with the system 200 described in relation to FIG. 2. As previously discussed, a subset of electrode pixels of the pixelated pad 202 or 502A-402C may be energized to selectively grasp an object, such as further discussed in relation to FIGS. 6A and 6B.

Examples of Selectively Grasping an Object Using a Pixelated Pad

Figure 6A:
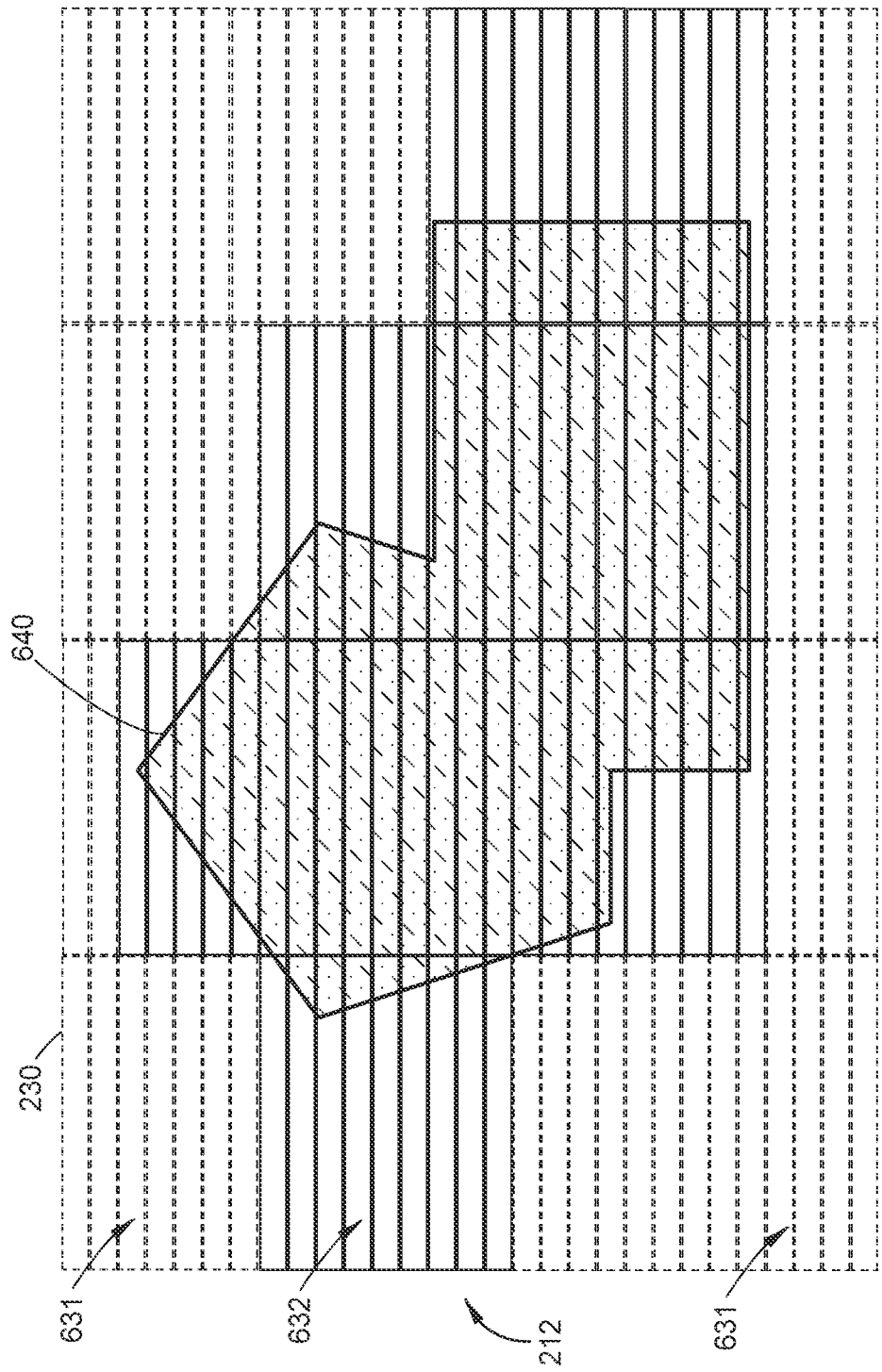
FIGS. 6A and 6B depict a subset of electrode pixels configured to grasp different objects, according to aspects of the present disclosure.
Figure 6B:
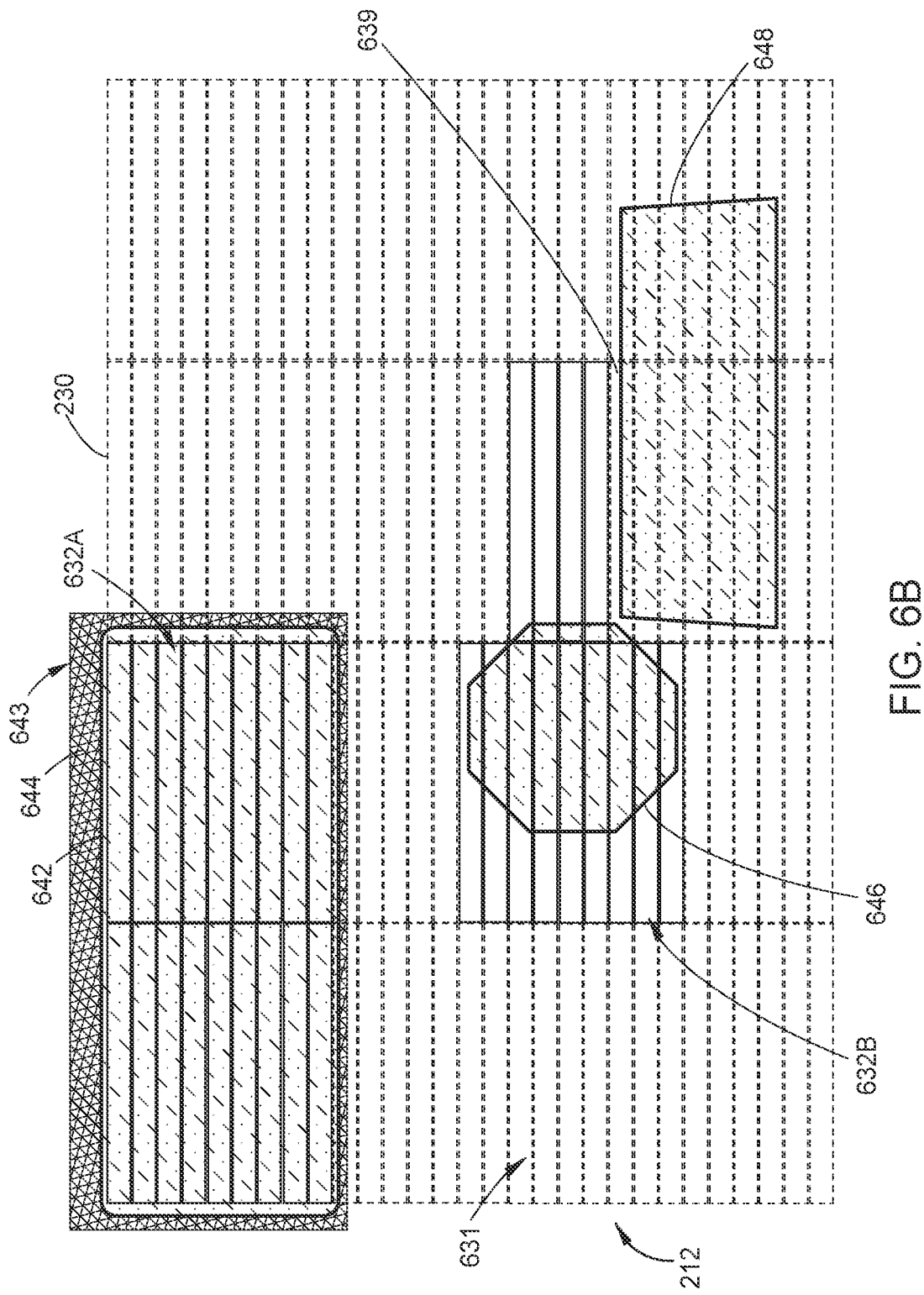

FIGS. 6A and 6B depict a subset of electrode pixels 632 configured to grasp different objects, according to an example of the present disclosure. In particular, FIGS. 6A and 6B show how one or more subsets (e.g., the subset of electrode pixels 632) of the plurality of electrode pixels 212 may be energized to selectively grasp (referred to as pick up) different objects. The views of FIGS. 6A and 6B are schematic in nature and not meant to be a perspective view of the pixelated pad (e.g., the pixelated pad 202 or 502A). For illustrative purposes, the hatching is used to identify objects, some of which may be picked up. The subset of electrode pixels 632 subset of the plurality of electrode pixels 212 are shown as solid lines while the remaining electrode pixels (e.g., non-energized electrode pixels 631) of the plurality of electrode pixels 212 are shown as dashed lines. For example, when an object is grasped, the subset of electrode pixels 632 are energized and the non-energized electrode pixels 631 are not energized.

As shown in FIG. 6A, the plurality of electrode pixels 212 are bounded by the perimeter 230. When used to pick up an object 640, the plurality of electrode pixels 212 are placed over the object 640 such that the object 640 is contained within the perimeter 230 when viewed from above as shown in FIG. 6A. In the depicted aspect, only the electrode pixels that are over the object 640 are energized. For example, each electrode pixel of the subset of electrode pixels 632 is over at least a portion of the object 640. Energizing only the subset of electrode pixels 632 beneficially allows the plurality of electrode pixels 212 to securely pick up the object 640 using fewer electrode pixels and less energy than conventional systems, while ensuring an edge of the object 640 does not fold over or become damaged.

A controller (e.g., the controller 204 in FIGS. 2 and 7) may be provided instructions to energize a subset of electrode pixels of the plurality of electrode pixels (e.g., the subset of electrode pixels 632 and the electrode pixels 212). The subset of electrode pixels 632 may be based on the shape of the object 640 to be grasped. In some aspects, the controller may be configured to determine a shape of the object 640 and to energize a subset of electrode pixels 632 of the plurality of electrode pixels based on the shape of the object 640. For example, a distance measurement system (e.g., the distance measurement system 208 in FIGS. 2 and 7) may determine a position and orientation of the object 640 in relation to the plurality of electrode pixels 212. The controller may interface with the distance measurement system to determine the shape and orientation of the object 640. The controller may determine a subset of electrode pixels (e.g., the subset of electrode pixels 632) to energize based on the shape and orientation of the object 640. In some aspects, the controller determines a subset of electrode pixels with the fewest amount of electrode pixels over the object 640. In some aspects, the controller determines a subset of electrode pixels (e.g., a first subset of electrode pixels 632A in FIG. 6B) with the most amount of electrode pixels that do not extend past a perimeter of an object (e.g. a first object 642 in FIG. 6B). In some aspects, the controller determines a subset of electrode pixels that satisfies a power or adhesion threshold. The controller may further control a motion system (e.g., the motion system 206 in FIGS. 2 and 7) to position and orient the determined subset of electrode pixels (e.g., the subset of electrode pixels 632) above the object 640.

As shown in FIG. 6B, the plurality of electrode pixels 212 may include multiple subsets of electrode pixels 632. For example, the plurality of electrode pixels 212 includes a first subset of electrode pixels 632A and a second subset of electrode pixels 632B. Each subset may correspond to an object to be picked up. In the depicted aspect, the first subset of electrode pixels 632A picks up a first object 642 and the second subset of electrode pixels 632B picks up a second object 646.

The first object 642 is a portion cut from a ply sheet 643. The remaining portion of the ply sheet 643 is a scrap material skeleton 644. The first subset of electrode pixels 632A is aligned to the first object 642 such that each electrode pixel of the first subset of electrode pixels 632A is contained within a perimeter of the first object 642. When energized, the first subset of electrode pixels 632A picks up the first object 642 and not the scrap material skeleton 644. Thus, the first subset of electrode pixels 632A selectively picks up the first object 642 while leaving behind the scrap material skeleton 644.

The second object 646 is positioned near a third object 648. The second subset of electrode pixels 632B is aligned such that each electrode pixel of the second subset of electrode pixels 632B is over at least a portion of the second object 646, but none of the electrode pixels are over the third object 648. For example, an electrode pixel 639 that is not energized is over the second object 646 and the third object 648. Although the electrode pixel 639 is over the second object 646, the second subset of electrode pixels 632B does not include the electrode pixel 639. Thus, when energized the second subset of electrode pixels 632B selectively picks up the second object 646 while leaving behind the third object 648.

Example Control Architecture

Figure 16:
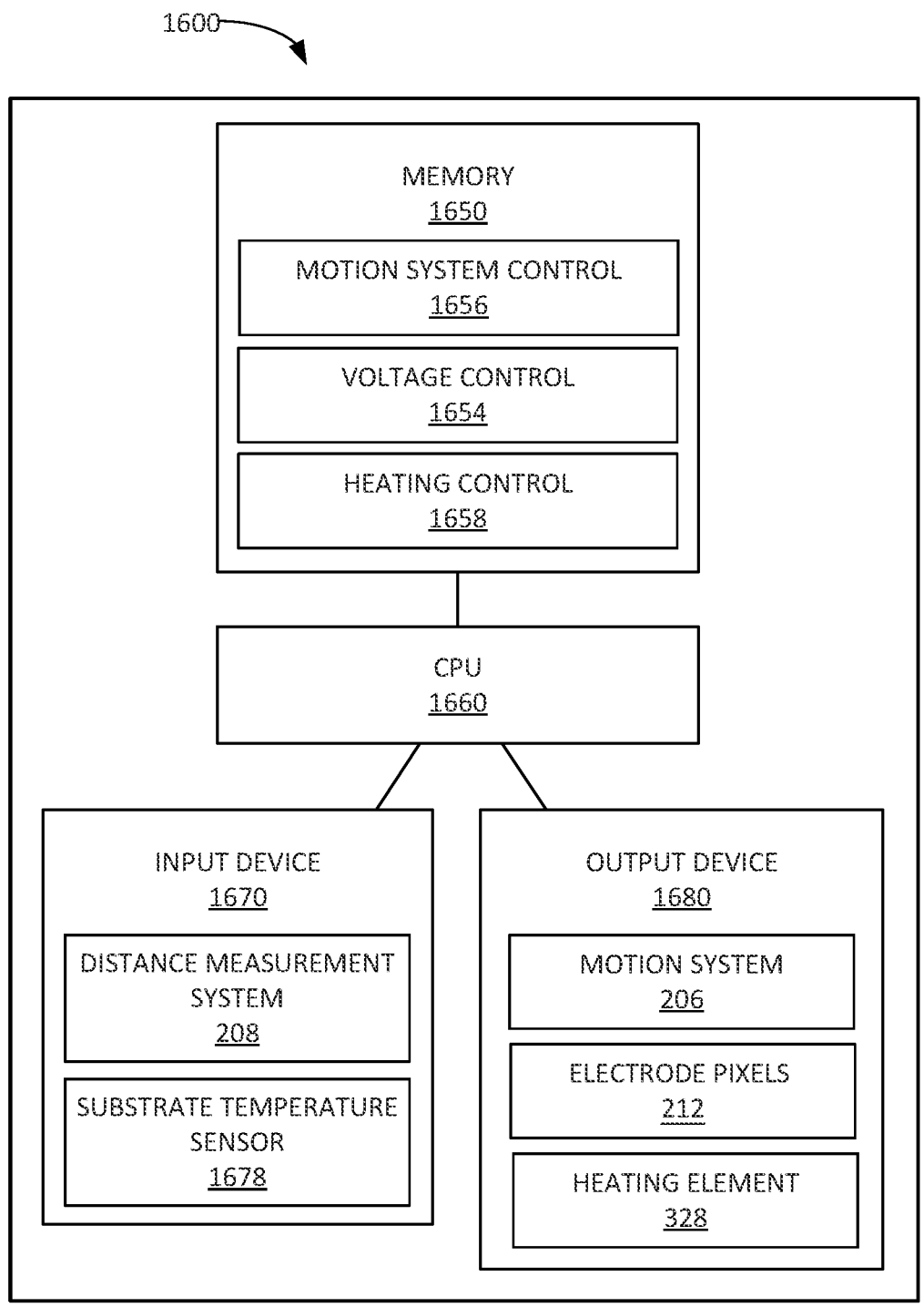
FIG. 16 depicts a computing device, according to aspects of the present disclosure.

FIG. 7 is a block diagram of a control architecture for a gripper apparatus, according to aspects of the present disclosure. A computer 710, such as the computing system 1600 discussed in greater detail in regard to FIG. 16, is in communication with an embedded controller 720, such as another instance of a computing system 1600 to manage and control various electrode pixels 730, as in a gripper apparatus 110 (e.g., per FIG. 1). In various aspects the computer 710 is a control station used by a user or operator to program or otherwise provide generalized control of the gripper apparatus 110, including movement in the environment, whereas the embedded controller 720 translates commands related to the activation and deactivation of the electrode pixels into individualizes activation/deactivation signals to selectively provide power to some of the electrodes in the gripper apparatus 110.

The embedded controller 720 communicates with the electrode pixels 730, distribution bus 740, and power supply 750 to manage the gripper apparatus 110 and which electrode pixels are activated or deactivated, when those electrode pixels are activated or deactivated, and what voltages are applied to the various activated electrode pixels. The electrode pixels 730 may represent some or all of the electrode pixels of the gripper apparatus 110, which may be arranged according to various layouts, such as those discussed in relation to FIGS. 2-6B, and variations thereof.

An Alternating Current (AC) source 760, such as mains power in a manufacturing facility, provides the power used to activate the electrode pixels 730, and a power supply 750 converts the incoming AC power to drive the electrode pixels 730 via Directed Current (DC) power at the indicated voltage level. The power supply 750 includes an AC/DC rectifier 751 to convert alternating current from the AC source into DC, and a High Voltage DC (HVDC) booster 752 to change the voltage level of the DC power to a desired voltage. The boosted DC voltage is then provided to a grip/release (GR) circuit under the control of the embedded controller 720 to set the desired system state or drive frequency in the electrode pixels 730.

Although generally discussed in relation to a single phase of AC power, the power supply 750 may use an AC source 760 offering two, three, or more phases of power. Additionally or alternatively, the embedded controller 720 may use a multiple power supplies 750, each associated with one phase of power offered by a multi-phase AC source 760. Additionally or alternatively, as the electrode pixels 730 are provided as several independently controllable groups, several power supplies 750 may be provided, each associated with one group of electrode pixels 730.

A distribution bus 740 carries the converted voltage from the GR circuit to the electrode pixels 730, and may receive commands from the embedded controller 720 to adjust which electrode pixels 730 receive power from a given power supply 750.

Example Voltage Driver Circuitry

Figure 8A:
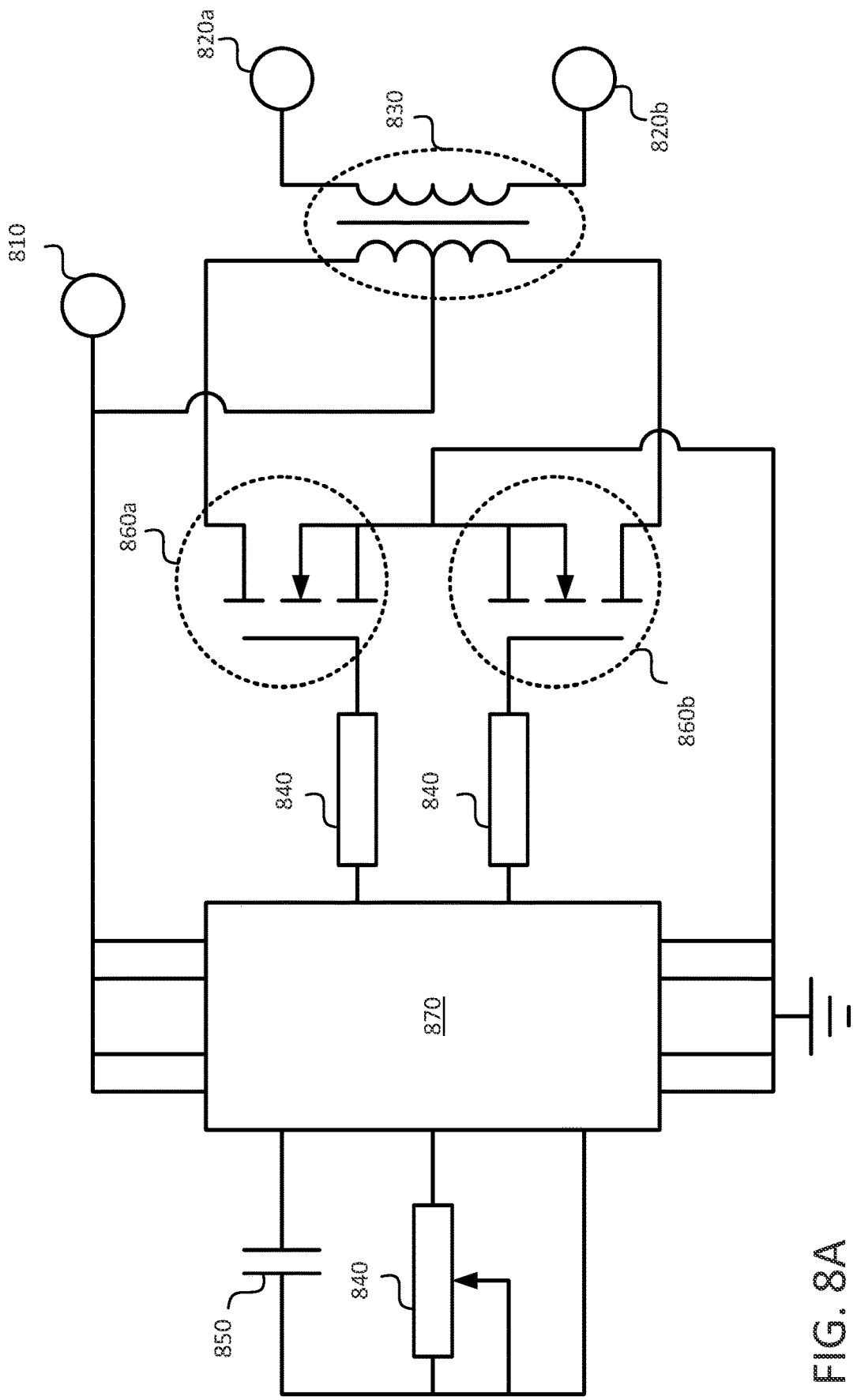
FIGS. 8A-8C depict example voltage driver circuitry, according to aspects of the present disclosure.
Figure 8B:
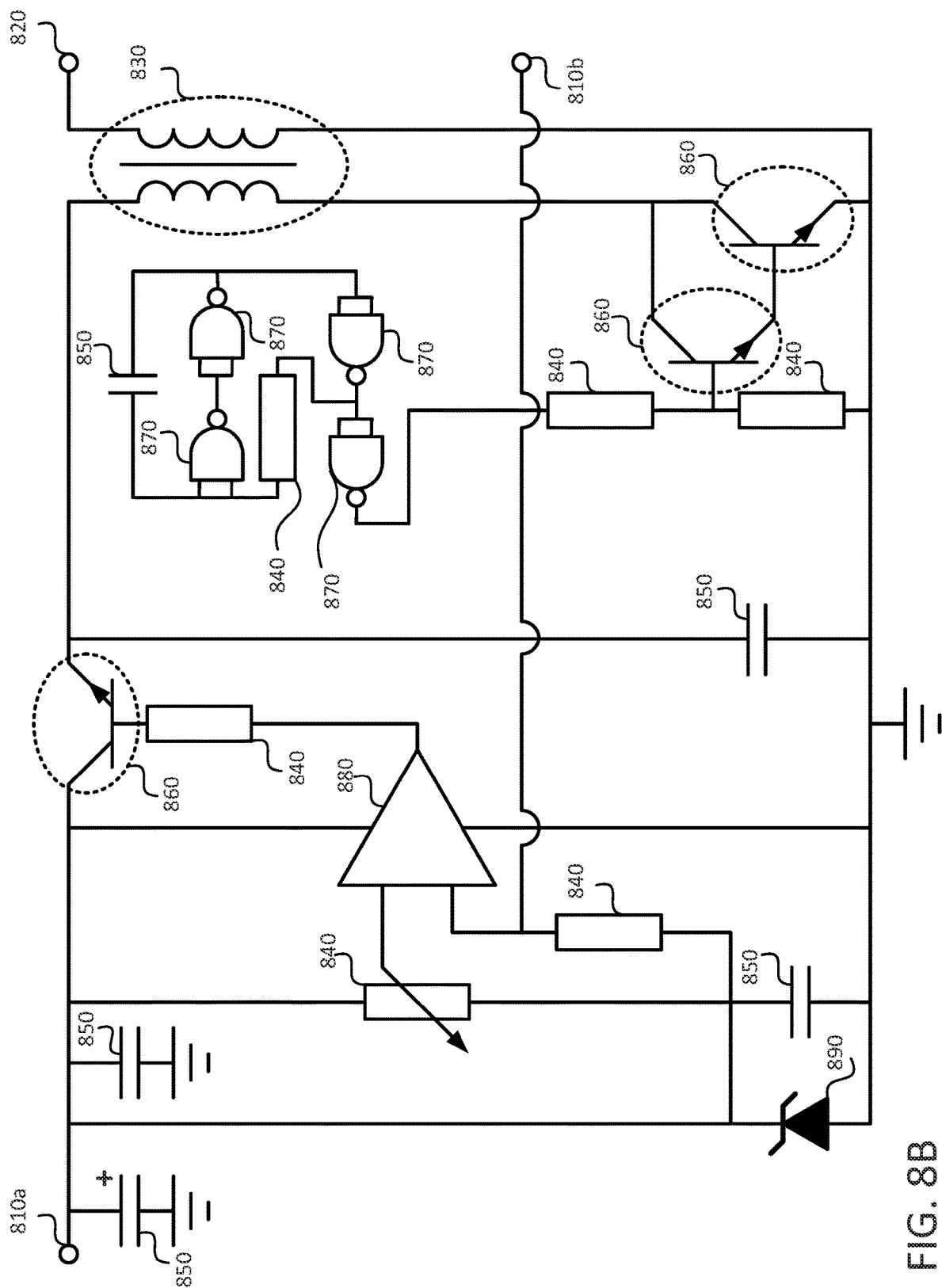
Figure 8C:
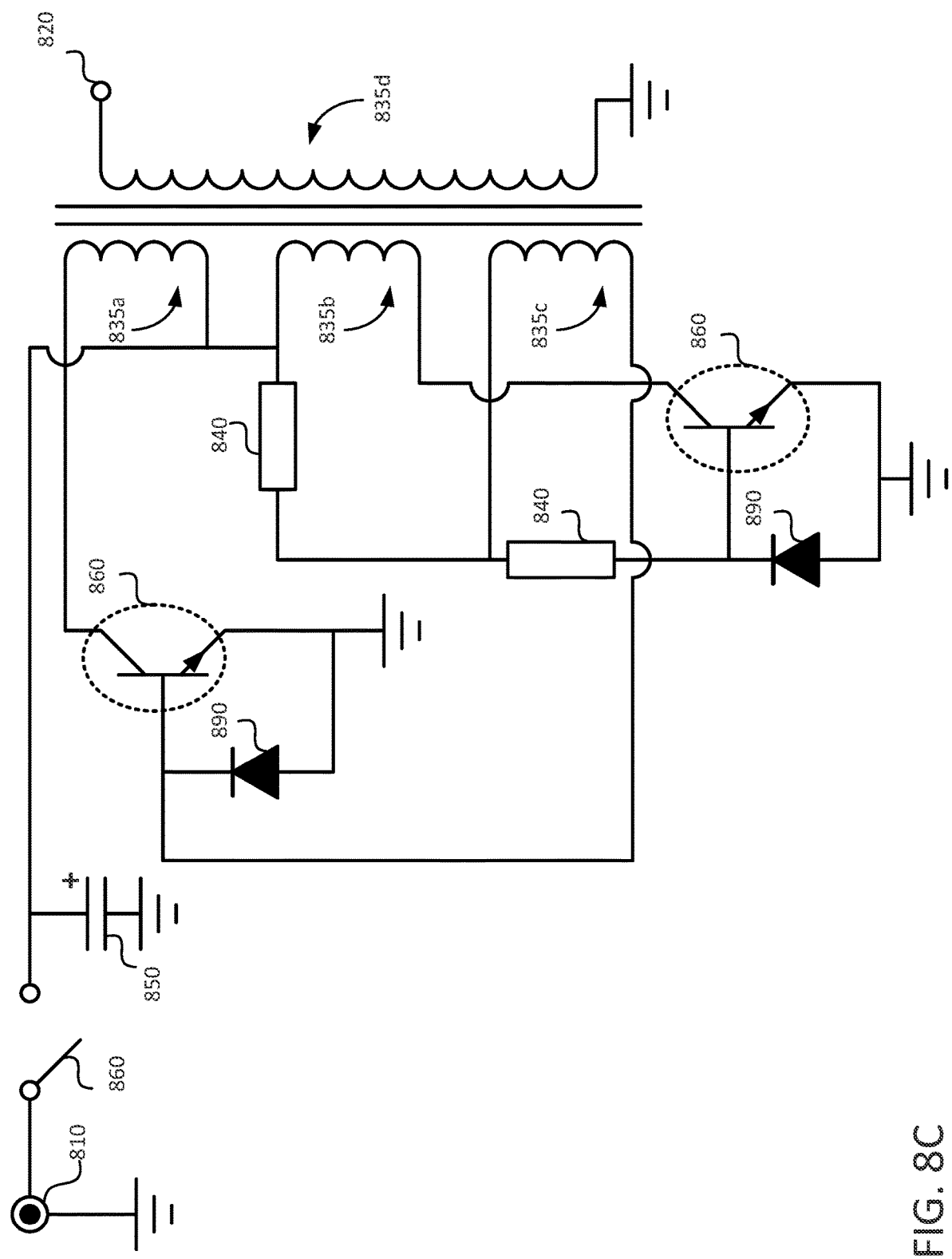

FIGS. 8A-8C depict example voltage driver circuitry, as may be provided in a power supply 750 of FIG. 7, according to aspects of the present disclosure. In various aspects, when several power supplies 750 are provided for the control of individual elements of the gripping surface of a gripper apparatus 110, the gripper apparatus 110 may include one or more of the circuit layouts shown in FIGS. 8A-8C.

FIG. 8A illustrates a half bridge center tap transformer drive, FIG. 8B illustrates a single-ended drive flyback converter, and FIG. 8C illustrates a Royer oscillator drive, which are non-limiting examples of hardware configurations for a power supply 750. Each of the illustrations include at least one power input 810*a-b* (generally or collectively, power input 810) for DC power, and a transformer 830 that provides at least one power output 820*a-b* (generally or collectively, power output 820) for AC power. As shown in FIG. 8C, the transformer 830 may be divided into several windings 835*a-d*.

Various hardware components such as resistors 840 (including varistors), capacitors 850, and switching elements 860 (e.g., switches, Metal Oxide Field Effect Transistors (MOSFETs), relays, Insulated Gate Bipolar Transistors (IGBTs), optocouplers) are employed in each of the hardware configurations, which may be controlled via various logic elements 870 (e.g., logic gates, embedded microcontrollers, external computing devices) to invert the DC input to an AC output of a desired amplitude and frequency. Additionally, various operational amplifiers 880 (including and diodes 890 may be deployed in the hardware configurations.

One of relevant skill in the art will appreciate various advantages to the different configurations for the power supplies, and may configure the control logic, hardware selections, and electrical values (e.g., capacitance, resistance, winding ratios) for the desired output AC power, based on the input DC power, or combinations thereof.

Example Power Control Circuitry

Figure 9A:
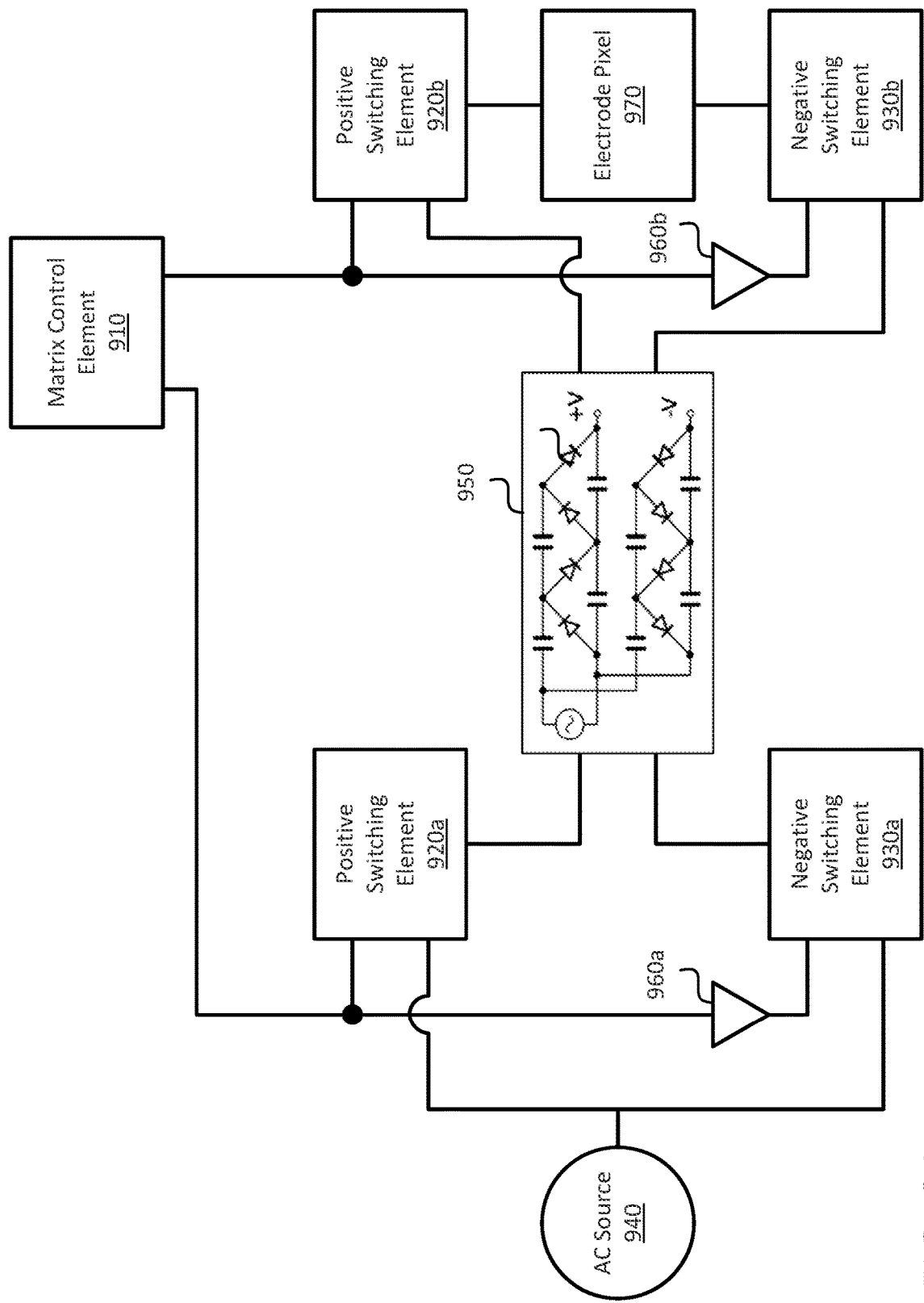
FIGS. 9A and 9B depict a power control architectures for a tile structure with a high-voltage generator, according to aspects of the present disclosure

FIG. 9A depicts a power control architecture for a tile structure with a high-voltage generator, according to aspects of the present disclosure. An AC source 940, such as a power supply 750, selectively applies an AC voltage to an electrode pixel 970 according to inputs set by a matrix control element 910 to select one or more electrode pixels 970 to activate.

The matrix control element 910, which may be a computing device, such as computing system 1600 discussed in relation to FIG. 16, sends signals to positive switching elements 920*a-b* (generally or collectively, positive switching elements 920) and negative switching elements 930*a-b* (generally or collectively, negative switching elements 930) to control whether a given gripping electrode pixel 970 receives a positive polarity voltage (e.g., via the positive switching elements 920) or a negative polarity voltage (e.g., via the negative switching elements 930).

In various aspects, the matrix control element 910 sends a first signal to both the first positive switching element 920*a* and the first negative switching element 930*a*, and a first signal inverter 960*a* (generally or collectively, signal inverter 960) inverts one of the signals (e.g., to activate one of the first positive switching element 920*a* and the first negative switching element 930*a* and deactivate or leave inactive the other one). Similarly, the matrix control element 910 may send a second signal to the second positive switching element 920*b* and the second negative switching element 930*b* and a second signal inverter 960*b* inverts one of the signals (e.g., to activate one of the second positive switching element 920*b* and the second negative switching element 930*b* and deactivate or leave inactive the other one). Accordingly, the control signals permit one of a paired positive switching element 920 and a negative switching element 930 to be activated at any given time, thus reducing the risk of shorting the electrical elements.

Each of the second positive switching element 920*b* and the second negative switching element 930*b* are associated with an individual electrode pixel 970, and various additional second positive switching element 920*b* and second negative switching element 930*b* (not illustrated) are provided for the individual control of additional electrode pixels 970 (not illustrated). Accordingly, the matrix control element 910 may be in communication with several pairs of second positive switching elements 920*b* and second negative switching elements 930*b* to individually control a corresponding plurality of electrode pixels 970.

The electrode pixel 970 is the modular unit of control for gripping an object via a gripper apparatus 110 according to the present disclosure. A gripper apparatus 110 may include several such electrode pixels 970 that are each individually controllable and powerable to grasp and release objects. Each electrode pixel 970 may exhibit one of three charge states (e.g., positive X kilovolts (kV), negative X kV, or may remain unpowered or grounded). Accordingly, the range of voltages experienced in the electrode pixel 970 when grasping an object is between 0-2X kV.

To reach the desired voltage levels (e.g., ±X kV) in the electrode pixels 970, the first positive switching element 920*a* and the first negative switching element 930*a* control the input voltage provided to a high voltage converter 950 from an AC source 940. The high voltage converter rectifies and multiplies the voltage received from the AC source 940 and provides two different polarities of output voltage for use in the electrode pixels 970 (e.g., ±X kV). In various aspects, the high voltage converter 950 is a Cockroft-Walton ladder, that provides a positive voltage amplified to +X kV and a negative voltage amplified to −X kV for use in the electrode pixel 970 via a ladder of capacitors with cross-linked "rungs" of diodes, where the diodes for the positive polarity output are oriented opposite to the diodes for the negative polarity output.

Figure 9B:
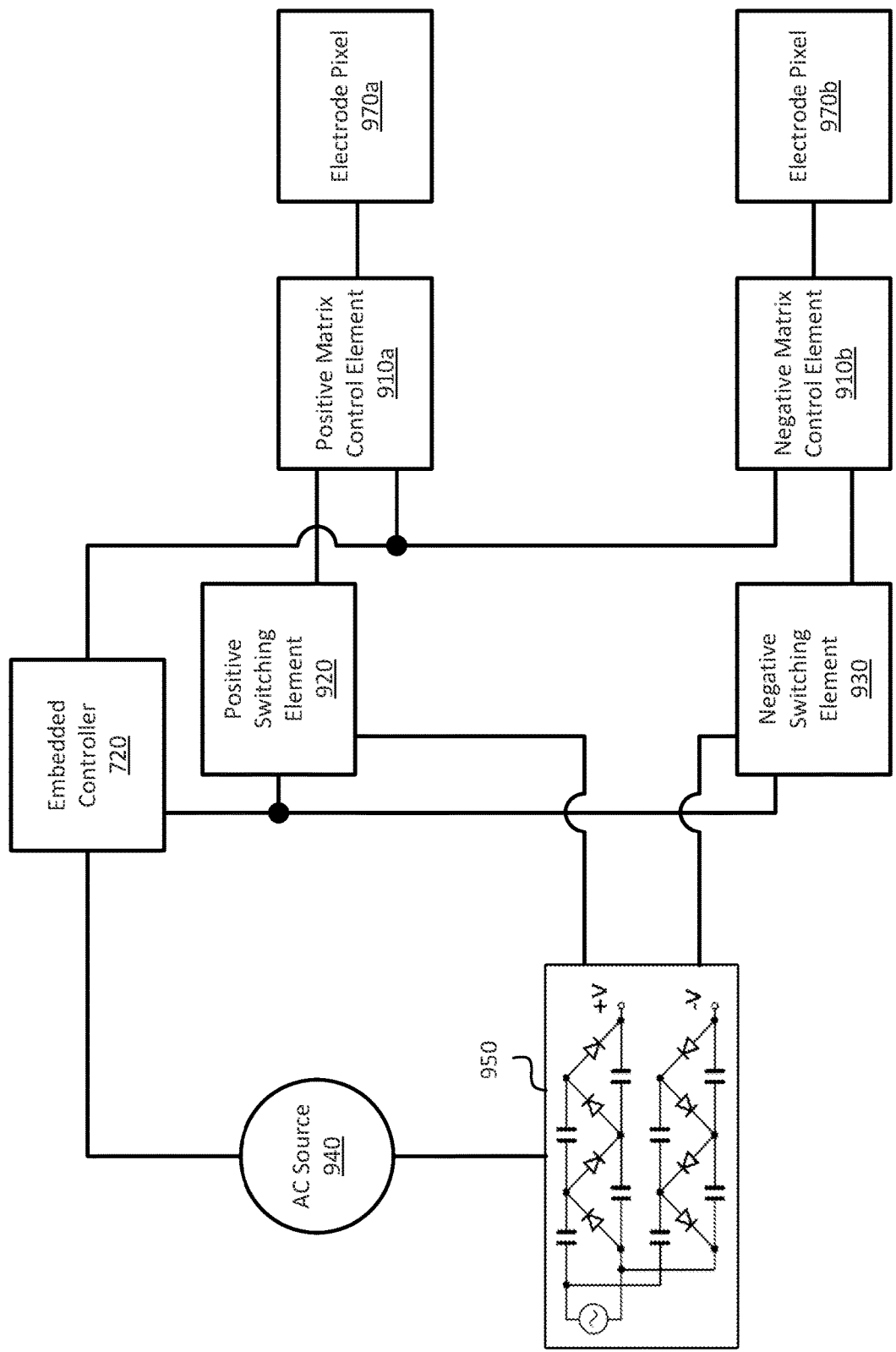

FIG. 9B depicts a power control architecture for a tile structure with a high-voltage generator, according to aspects of the present disclosure. An AC source 940, such as a power supply 750, selectively applies an AC voltage to electrode pixels 970*a* and 970*b* according to inputs set by respective matrix control elements 910*a* and 910*b* per signals sent from the embedded controller 720 drive the two or more electrode pixels 970*a* and 970*b* at different polarities (e.g., positive and negative).

The embedded controller 720, which may be a computing device, such as computing system 1600 discussed in relation to FIG. 16, sends signals to positive switching elements 920 and negative switching elements 930 to control whether a given electrode pixel 970 receives a positive polarity voltage (e.g., via the positive switching elements 920) or a negative polarity voltage (e.g., via the negative switching elements 930). In various aspects, the circuit layouts of the switching elements may be those discussed in greater detail in regard to FIG. 10 with respect to the gripping and release circuits 1020.

In various aspects, the matrix control elements 910 further control when the associated electrode pixels 970 are activated via the supplied voltages. Accordingly, the control signals permit one of a paired positive switching element 920 and a negative switching element 930 to be activated at any given time, thus reducing the risk of shorting the electrical elements.

Each of the second positive switching element 920*b* and the second negative switching element 930*b* are associated with an individual electrode pixel 970, and various additional second positive switching element 920*b* and the second negative switching element 930*b* (not illustrated) are provided for the individual control of additional electrode pixels 970 (not illustrated). Accordingly, the matrix control element 910 may be in communication with several pairs of second positive switching elements 920*b* and second negative switching elements 930*b* to individually control a corresponding plurality of electrode pixels 970.

The high voltage converter rectifies and multiplies the voltage received from the AC source 940 and provides two different polarities of output voltage for use in the electrode pixels 970 (e.g., ±X kV). In various aspects, the high voltage converter 950 is a Cockroft-Walton ladder, that provides a positive voltage amplified to +X kV and a negative voltage amplified to −X kV for use in the electrode pixels 970 via a ladder of capacitors with cross-linked "rungs" of diodes, where the diodes for the positive polarity output are oriented opposite to the diodes for the negative polarity output.

Example Tile and Zone Switching Circuitry

Figure 10:
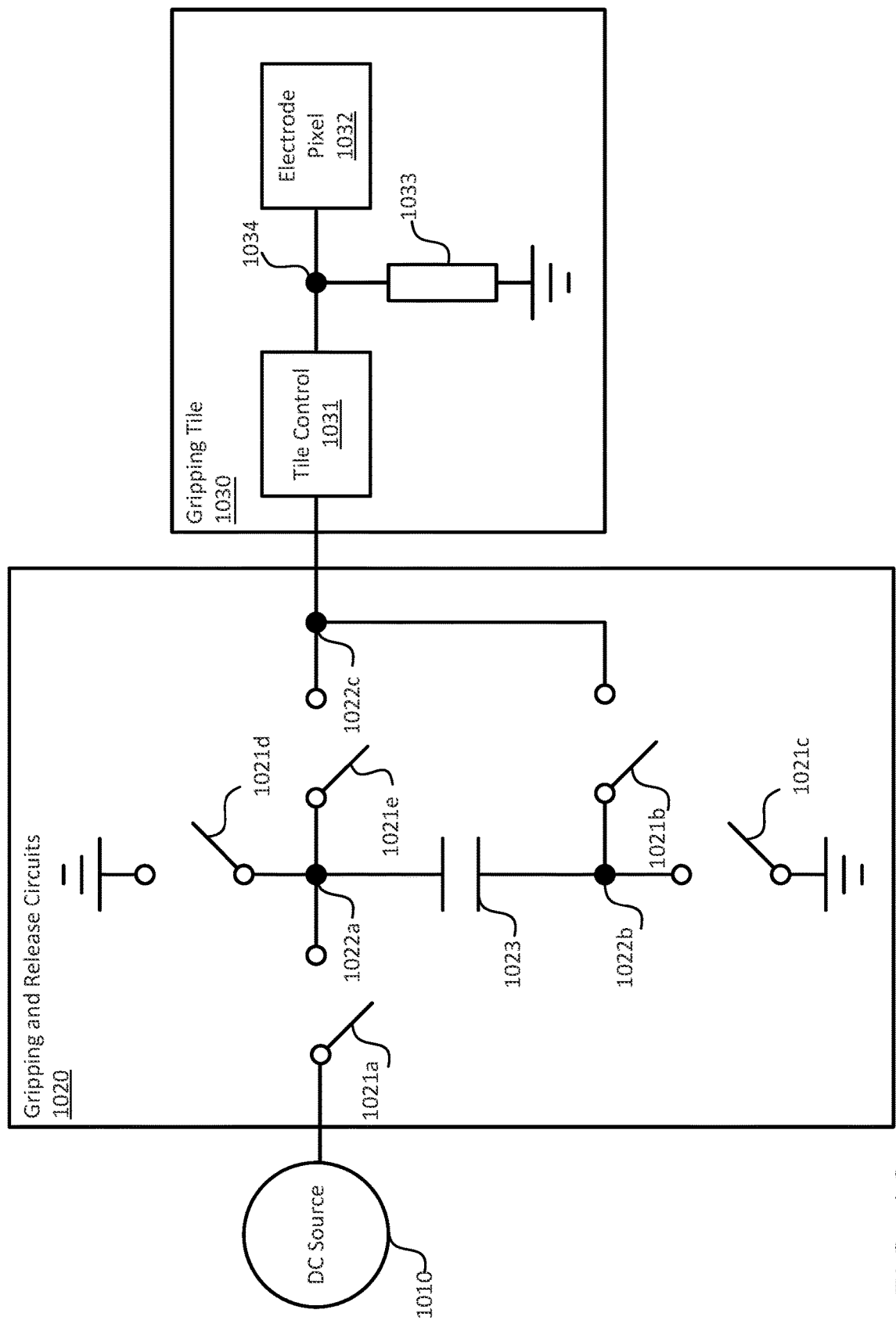
FIG. 10 depicts a switching unit, according to aspects of the present disclosure.

FIG. 10 depicts a tile and zone switching unit 1000, according to aspects of the present disclosure. A DC source 1010, such as a power supply 750, is connected to two or more gripping and release circuits 1020 (e.g., at least one for each polarity), which in turn are selectively connected to one or more gripping tiles 1030. In various aspects, at least two gripping and release circuits 1020 are provided with each manipulator and array of electrode pixels; one for each polarity. The gripping and release circuits 1020 may be understood as separate gripping circuits and release circuits, or as a combined arrangement of switching elements. Although FIG. 10 depicts all of the switches 1021*a-e* (generally or collectively, switch 1021) as single pole single throw switches (in a normally open configuration), various other types of switches 1021 can be used (including gated semiconductors), with various numbers of the switches 1021 being of various different types or configurations.

The gripping and release circuits 1020 include a first switch 1021*a* connected between the DC source 1010 and a first node 1022*a*, a capacitor 1023 connected between the first node 1022*a* and a second node 1022*b*, a second switch 1021*b* connected between the second node 1022*b* and a third node 1022*c* (e.g., an electrode control node) for various gripping tiles 1030, a third switch 1021*c* connected between the second node 1022*b* and ground, a fourth switch 1021*d* connected between the first node 1022*a* and ground, and a fifth switch 1021*e* connected between the first node 1022*a* and the third node 1022*c*.

Figure 11:
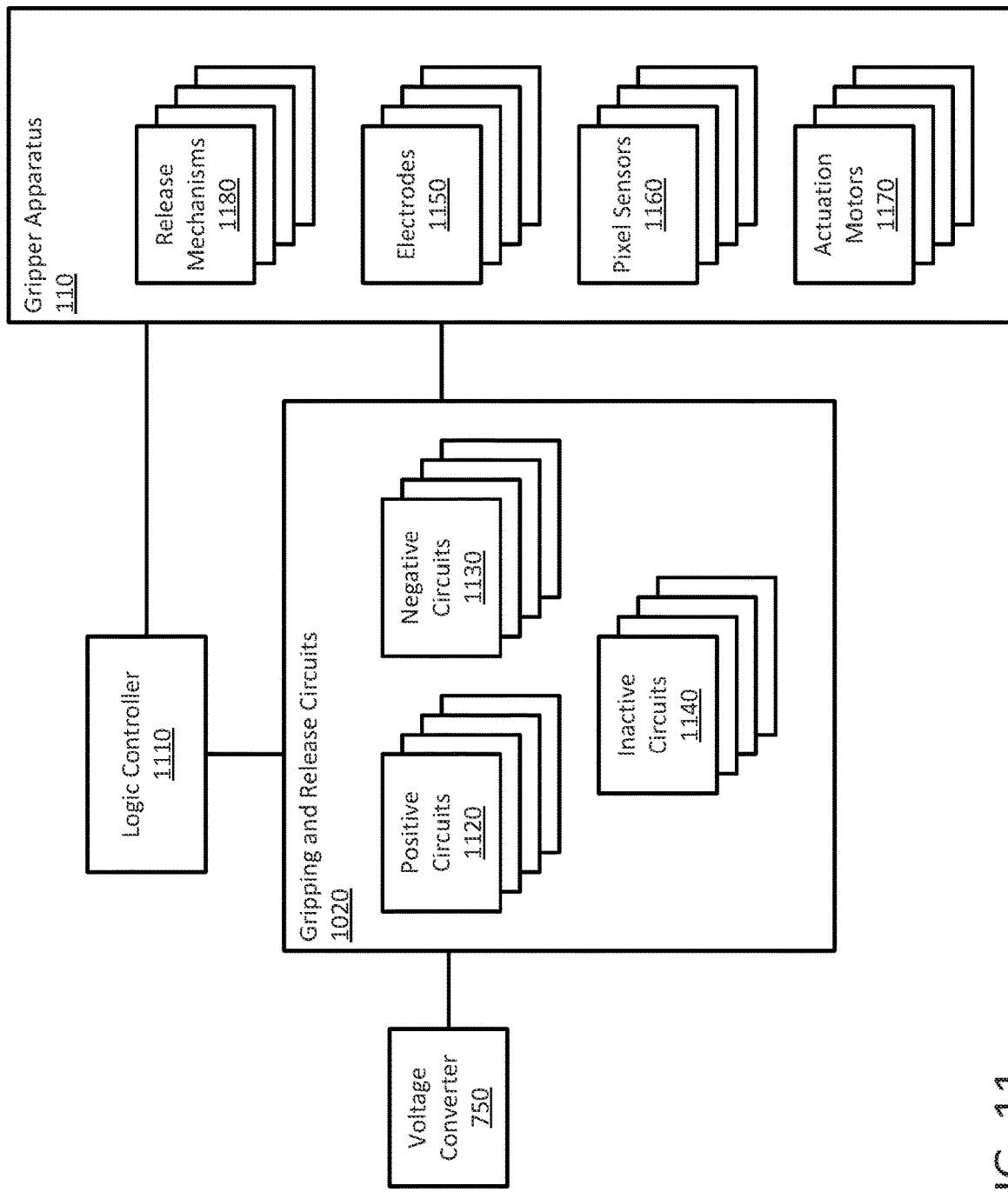
FIG. 11 depicts a control unit, according to aspects of the present disclosure.

Each of the switches 1021 may be individually or collectively controlled (e.g., by the logic controller 1110, discussed in relation to FIG. 11) to change the source and polarity of voltage provided to an associated gripping tile 1030. For example, power can be supplied from the DC source 1010 to activate the gripping tile 1030 and charge the capacitor 1023 at the same time. In another example, power can be supplied from the capacitor 1023 to activate the gripping tile 1030 with an opposite polarity of power from that received from the DC source 1010 (e.g., discharging the capacitor 1023).

When supplying power from the DC source 1010 (to activate the gripping tile 1030 and charge the capacitor 1023), the first switch 1021*a*, the third switch 1021*c*, and the fifth switch 1021*e* are closed, while the second switch 1021*b* and the fourth switch 1021*d* are open in a first arrangement. In the first open/closed arrangement of the switches 1021, provides an output voltage at a first polarity to the gripping tiles 1030 and charges the capacitor 1023 from the DC source 1010, and the gripping and release circuit 1020 is controllable to reverse the open and closed states (e.g., opening closed switches 1021 and closing open switches 1021) as part of a duty cycle of alternating polarities to grasp an object or to release an object.

When reversed, the gripping and release circuit 1020 provides the output voltage at a second (opposite) polarity, and the first switch 1021*a*, the third switch 1021*c*, and the fifth switch 1021*e* are open, while the second switch 1021*b* and the fourth switch 1021*d* are closed in a second arrangement. Similarly, when the switches are in the second arrangement, the gripping and release circuit 1020 is controllable to reverse the open and closed states (e.g., opening closed switches 1021 and closing open switches 1021) as part of a duty cycle of alternating polarities to grasp an object or to grasp a new object or previously release object.

As will be appreciated, other open/closed arrangements of the switches 1022 are possible for discharging the capacitor 1023 without powering the gripping tile 1030 (e.g., bleeding off charge), powering the gripping tile 1030 from the DC source 1010 without charging the capacitor 1023, and the like.

The gripping tile 1030 includes a tile control 1031 (e.g., an enabling switch or localized logic controller) to control when to accept power from the gripping and release circuits 1020, which is located between the third node 1022*c* of an associated gripping and release circuit 1020 and a shared node 1034 in the gripping tile 1030. In various aspects, the tile control 1031 may selectively connect to different third nodes 1022*c* in different gripping and release circuits 1020 when the gripping tile 1030 is designated as part of a first subset or a second subset of electrodes for a gripping operation (e.g., to a first gripping and release circuit 1020 associated with the first subset or a second gripping and release circuit 1020 associated with the second subset). In other aspects, the tile control 1031 may selectively disconnect (e.g., by opening a switch therein) from an associated gripping and release circuit 1020 when the associated gripping tile 1030 is not designated as part of a subset of electrodes for a gripping operation (e.g., when the gripping and release circuit 1020 is associated with n gripping tiles usable as a first subset of electrodes, but n-m gripping tiles are selected to grasp an object).

The electrode pixel 1032 includes one or more electrodes that are designated to receive the voltage provided by a connected gripping and release circuit 1020, either from the DC source 1010 or as discharged from the capacitor 1023 to grasp and release an object. Depending on the number of electrode pixels 1032 included in the gripping tile 1030, each electrode pixel 1032 may have a corresponding tile control 1031 to connect to (or remain disconnected from) a different gripping and release circuit 1020.

In various aspects, the gripping tile 1030 may include two or more tile controls 1031 to simultaneously connect various electrode pixels 1032 in the gripping tile 1030 to a first gripping and release circuit 1020 carrying a first polarity voltage, and various other electrode pixels 1032 in the gripping tile 1030 to a second gripping and release circuit 1020 carrying a second polarity voltage (and optionally leave various other electrode pixels 1032 in the gripping tile 1030 disconnected from any gripping and release circuits 1020).

A return resistor 1033 is provided in the gripping tile 1030 when generating the inverted voltage via the gripping and release circuit 1020 to provide current flow at the inverted voltage. Additionally, when the gripping and release circuit 1020 is inactivated (e.g., turned off or otherwise set to 0 V), the return resistor 1033 to prevent the electrode pixel 1032 from electrically floating when adjacent electrode pixels 1032 in the array are energized. Accordingly, the return resistor 1033 reduces the risk of losing resolution on the gripping surface and potentially gripping (or not releasing) an unintended portion of an object.

Example Control Unit

FIG. 11 depicts a control unit, according to aspects of the present disclosure. The control unit includes a logic controller 1110, which may be a computing device, such as computing system 1600 discussed in relation to FIG. 16, that controls the gripping and release circuits 1020 (e.g., as discussed in relation to FIG. 10) to set various switching arrangements to define positive circuits 1120 (e.g., gripping and release circuits 1020 that are configured to carry a positive voltage to the associated electrode pixels), negative circuits 1130 (e.g., gripping and release circuits 1020 that are configured to carry a negative voltage to the associated electrode pixels), or neutral circuits 1140 (e.g., gripping and release circuits 1020 that are inactive or otherwise not charging or discharging associated electrodes 1150 for the electrode pixels).

The logic controller 1110 can select which ones of the gripping and release circuits 1020 to use as positive circuits 1120, negative circuits 1130, or inactive circuits 1140 based on the shape of the object to be gripped, where the gripper apparatus 110 will grip that object on the gripping surface, a gripping scheme (e.g., alternating or constant polarities), a duty cycle, a grasp command, a release command, or the like. Additionally, the logic controller 1110 may switch the polarity (or remove the applied voltage) provided to the associated electrodes 1150 by re-designating one or more of the gripping and release circuits 1020 to be positive circuits 1120, negative circuits 1130, or inactive circuits 1140 (e.g., in response to a grasp command, a release command, or a duty cycle). Depending on how the logic controller 1110 has designated the various gripping and release circuits 1020, power from the power supply 750 is provided to the associated electrodes 1150 with a positive polarity, a negative polarity (or not provided to the associated electrodes 1150) either from a power supply 750 or a charging capacitor (1023) according to a switching arrangement in the individual gripping and release circuits 1020.

In addition to controlling the switch states in the gripping and release circuits 1020, the logic controller 1110 also communicates with the gripper apparatus 110 to ensure that the objects are properly gripped and released as commanded. Various pixel sensors 1160 are associated with each of the electrode pixels, which may include light sensors that are obscured when an object is gripped by the associated electrodes 1150 (registering a dimming of light when the object is grasped or an intensifying of light when the object is released), contact or voltage sensors that register the presence of a grasped object, a distance sensor, or the like. The pixel sensors 1160 may also include temperature sensors to monitor the temperature of a given electrode pixel (e.g., to control whether a heating resistor or other heating element is activated), or positional sensors (e.g., integrated in actuation motors of the gripper apparatus 110) to monitor a relative position of the gripper apparatus 110 in the environment.

In various aspects, the logic controller 1110 controls various release mechanisms 1180 associated with the electrode pixels to physically push the object off of the gripper apparatus 110 in addition to or instead of electrostatic release by the electrode pixels. In some aspects, the logic controller 1110 activates the release mechanisms 1180 in response to a release command (e.g., in tandem with the electrostatic release), in response to the pixel sensors 1160 indicating that the object is still held by the gripper apparatus after a threshold amount of time since attempting to release the object (e.g., when electrostatic release has failed or is taking longer than expected), or without electrostatically releasing the object (e.g., keeping the electrodes 1150 in a gripping state when electrostatic release would be undesirable). In various aspects, the release mechanisms 1180 can include air vents that use blowing air to disengage the object, plungers (e.g., controlled by a solenoid, motor, or spring) to push the object off of the gripping surface, additional or alternative electrodes (e.g., configured to operate at higher voltages), or the like.

Example Heating Elements

Figure 12A:
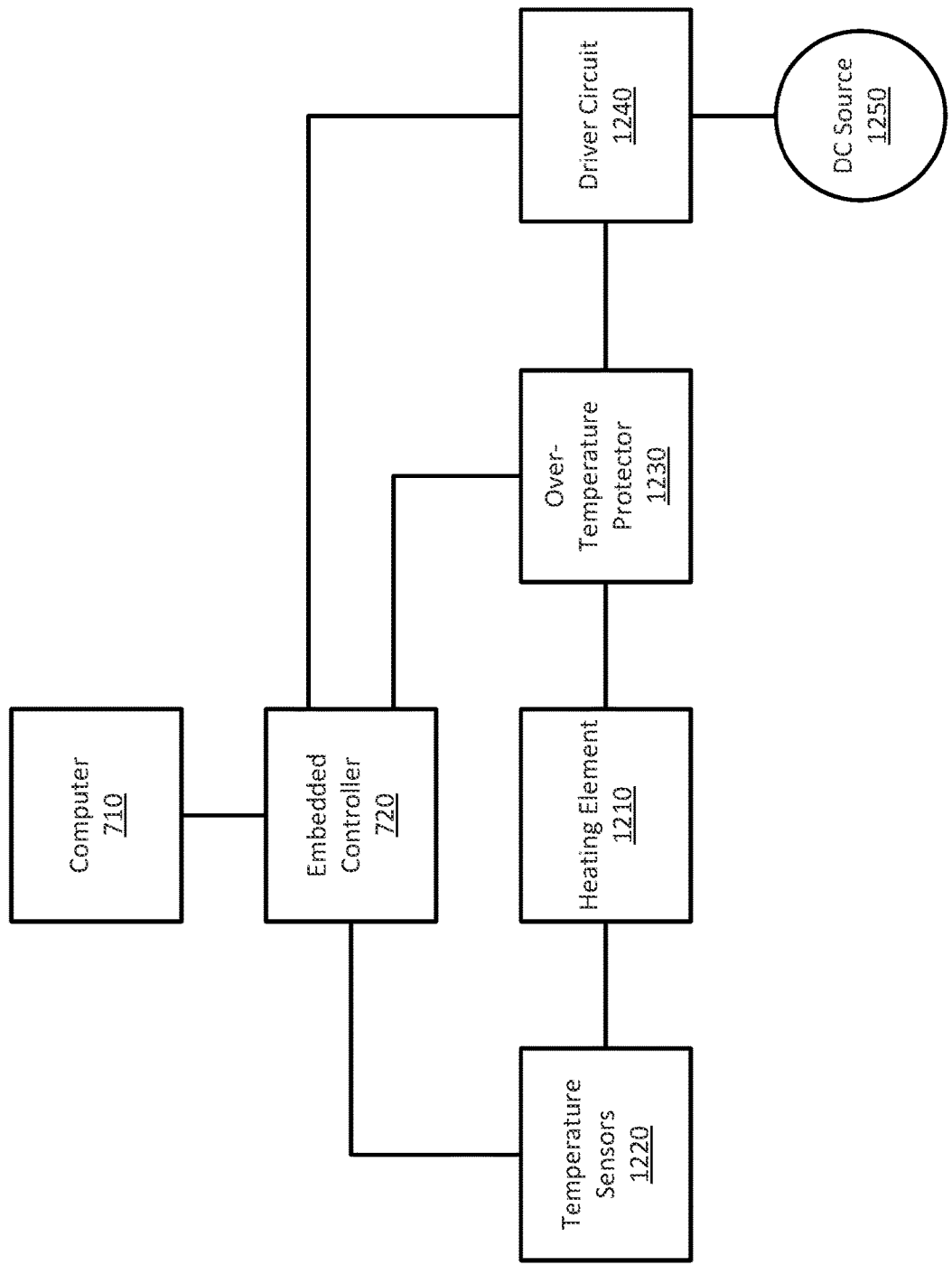
FIGS. 12A and 12B depict layouts for a heating element for use with a gripper apparatus, according to aspects of the present disclosure.
Figure 12B:
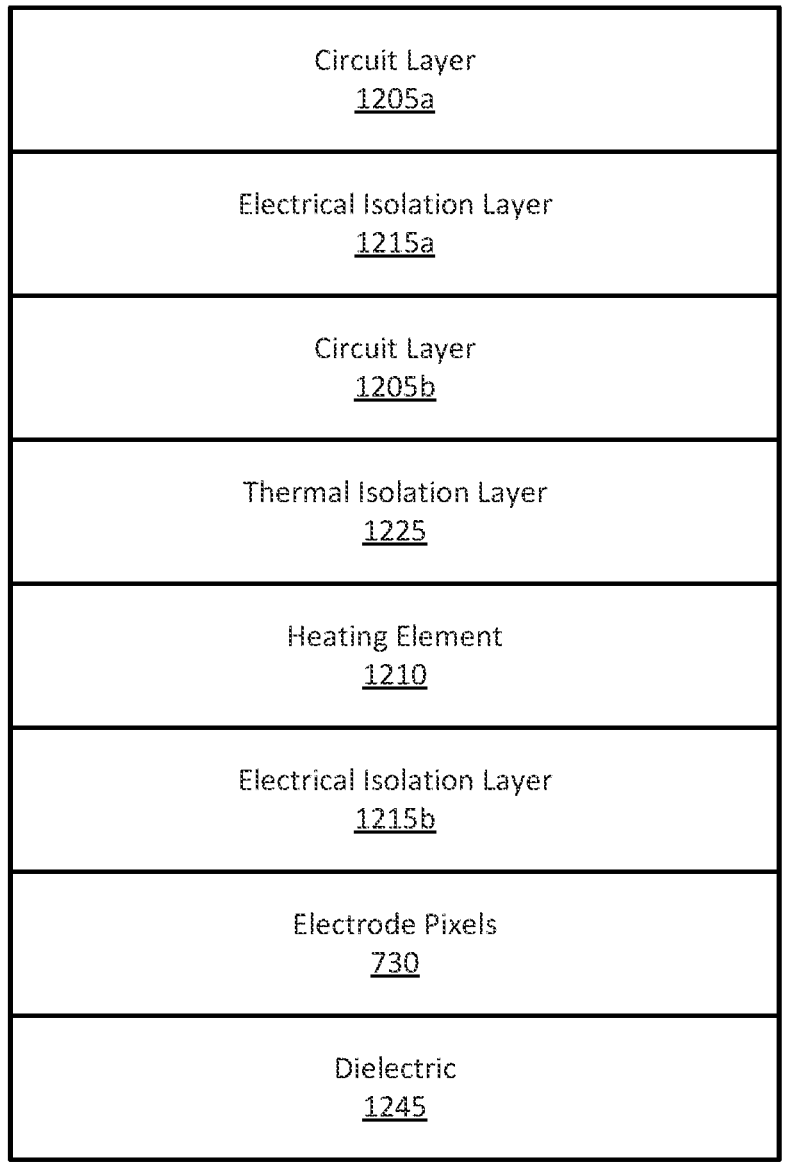

FIGS. 12A and 12B depict layouts for a heating element 1210 for use with a gripper apparatus 110, according to aspects of the present disclosure.

FIG. 12A illustrates an example circuit layout for controlling a heating element 1210 embedded in a gripper apparatus 110, according to aspects of the present disclosure. The heating element 1210, which may include various resistive elements arranged in a known pattern in the gripping surface of the gripper apparatus 110. A driver circuit 1240 controlled by the embedded controller 720 selectively provides power from a DC source 1250 through the heating element 1210 to resistively produce heat in the heating element 1210 that is radiated to the surrounding elements in the gripper apparatus 110.

Various temperature sensors 1220 are disposed in the gripper apparatus 110 to monitor the temperature of the gripping surface and report the measured temperature back to the embedded controller 720. The computer 710 send a set temperature command to the embedded controller 720 to adjust the desired temperature in the gripping surface and a rate at which to reach the desired temperature to affect the driver circuit 1240 to provide an 100% on/off provision of power from the DC source 1250, a stepped power control of power from the DC source 1250, or a Proportional (P) Integrated (I) Derivative (D) control of power from the DC source 1250 and variations thereof (e.g., P, PI, PD, or PID).

In various aspects, the over-temperature protector 1230 is a switch monitored by the embedded controller 720 to break contact when the temperature sensors 1220 indicate that the gripping surface has reached a threshold temperature. In some aspects, the over-temperature protector 1230 includes a thermocouple that breaks contact when a bi-metal reaches a threshold temperature.

FIG. 12B illustrates an example layer stack of where the heating element 1210 is embedded relative to the electrode pixels 730 in a gripper apparatus 110, according to aspects of the present disclosure. The layer stack for the gripping surface may include various layers of electronics and electrical insulation (e.g., a first circuit layer 1205a, a second circuit layer 1205b, and a first electrical isolation layer 1215a located between) that include the various circuits and electrical elements from controlling and monitoring the gripper apparatus 110. These electronic control components are separated from the gripping and heating components by a thermal isolation layer 1225, which further helps contain heat generated by the heating elements 1210 to the gripping surface and the electrode pixels 730 rather than the opposite side of the gripper apparatus 110. Although not illustrated, various traces or wires may penetrate the isolation layers to provide power to elements in other layers or receive signals back from those elements.

The heating element 1210 is disposed between the thermal isolation layer 1225 and a second electrical isolation layer 1215b, which shields the heating elements 1210 from the high voltages used to control the electrode pixels 730 when grasping or releasing objects. A dielectric layer 1245 is disposed on the electrode pixels 730 to separate the electrode pixels 730 from any objects 140 gripped and to protect the electrode pixels 730 from arcing when voltage is applied thereto.

Example Methodologies

Figure 13:
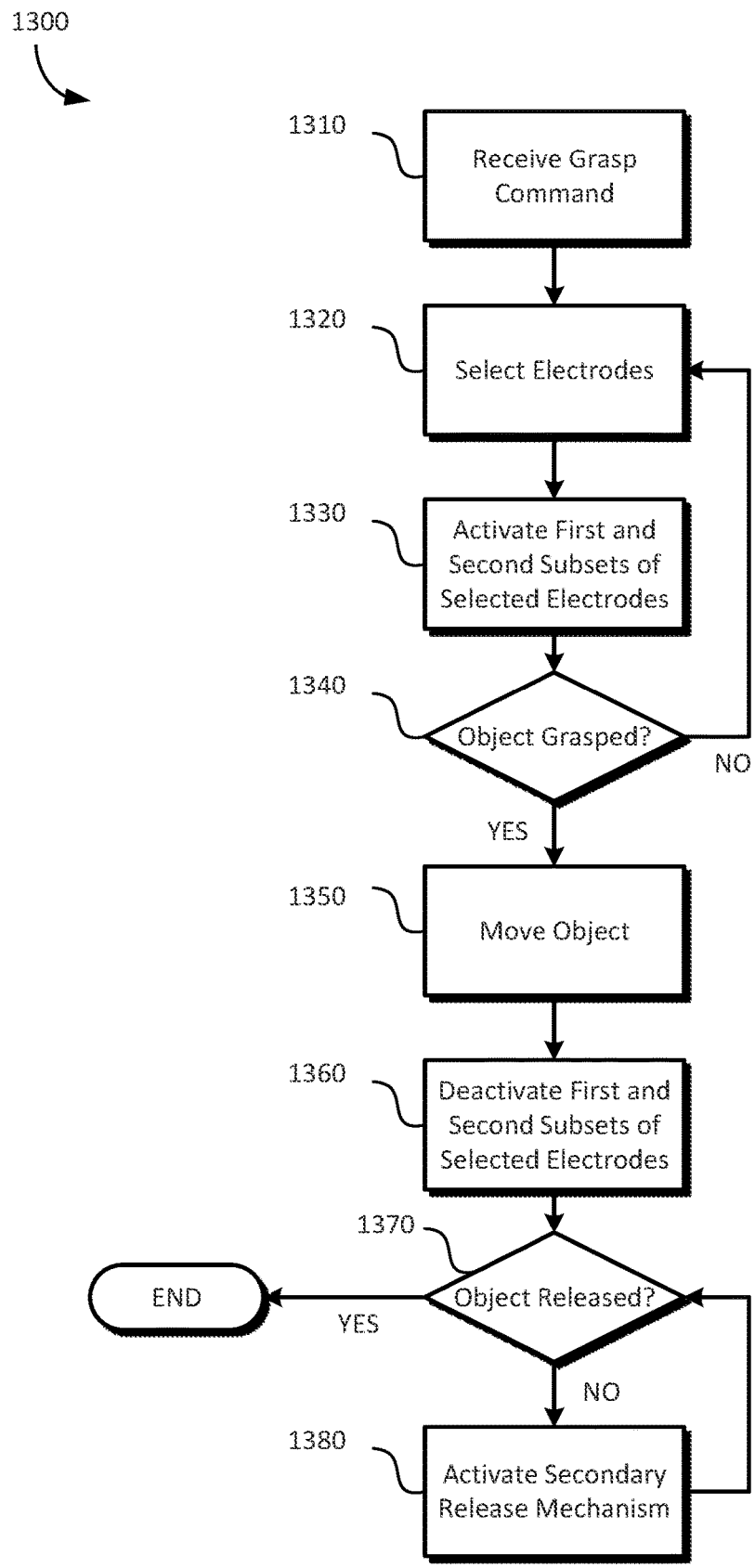
FIG. 13 is a flowchart of a method for controlling a gripper apparatus, according to aspects of the present disclosure.

FIG. 13 is a flowchart of a method 1300 for controlling a gripper apparatus, according to aspects of the present disclosure. Method 1300 begins at block 1310, where the logic controller 1110 of a gripper apparatus receives a grasp command to grasp one or more objects. The grasp command may include one or more of: a material type for the object to-be-grasped, a silhouette, perimeter, or outline of the object, initial coordinates of an object in space, intended final coordinates for the object space, an initial relative location of the object in a pile or material selection area, and an intended final relative location. In various aspects, the grasp commands for several objects can be received in sequence (e.g., a first command for a first object, a second command for a second object, etc.) and batched into one grasp command by the logic controller 1110 (e.g., a batched command for a first and second object), or received as a single command from a controlling or external computer to grasp the indicated objects. Additionally, the logic controller 1110 may queue various grasp commands to move intervening or blocking objects at appropriate times to overall object handling speed for the gripper apparatus, to increase the percentage of the gripping surface used, manage power in the gripper apparatus, etc.

At block 1320, the logic controller 1110 selects the electrodes to grasp the indicated objects from the grasp command. In various aspects, logic controller 1110 uses the silhouettes of the objects to-be-grasped according to method 1400, discussed in relation to FIG. 14, to select which electrodes to activate. The logic controller 1110 may adjust the position of the gripper apparatus relative to the object to align the selected electrodes with the object for grasping.

At block 1330, the logic controller 1110 activates a first subset and a second subset of the electrodes selected per block 1320 to grasp the object. In various aspects, the logic controller 1110 selects the first subset of electrodes to carry a voltage at a first polarity and the second subset of electrodes to carry a voltage at a second polarity (opposite to the first polarity) for a duration of the grasping action (e.g., until the object is to be released). In some aspects, the logic controller 1110 selects the first subset of electrodes and the second subset of electrodes to carry voltages of opposing polarities according to a duty cycle for the duration of the grasping action (e.g., alternating positive/negative voltages until the object is to be released). The selection and application of different voltages to activate the different electrodes is discussed in greater detail in regard to method 1500 in relation to FIG. 15.

Although generally discussed herein in relation to a first subset and a second subset of electrodes, in various aspects the logic controller 1110 may select and control n subsets of electrodes to grasp multiple objects at the same time, but allow the individual pick up or drop off of the various objects. For example, a first subset and a second subset of electrodes grasp a first object while a third subset and a fourth subset of electrodes grasp a second object, and the logic controller 1110 can individually signal the paired first/second subsets to pick up or drop off the first object and the paired third/fourth subsets to pick up or drop off the second object. The control may also be understood at the level of the gripping and release circuits where the grasp (and release) commands set a state or mode of in the gripping and release circuits that is applied to the associated electrodes. Accordingly, to sequentially pick up (or release) objects, the image is updated at the appropriate time, which can include the addition or removal of a given sub-image associated with various regions on the gripping surface.

At block 1340, the logic controller 1110 determines whether the object has been grasped. In various aspects, the logic controller 1110 receives inputs from various pixel sensors 1160, which may include light sensors that are obscured when an object is gripped by the associated electrodes 1150 (registering a dimming of light when the object is grasped), contact or voltage sensors that register the presence of a grasped object, a distance sensor, or the like. When the logic controller 1110 determines that the object has not been grasped, method 1300 returns to block 1320 to re-select the electrodes for grasping the object (e.g., avoiding a bad cell in the selected electrodes, expanding or re-organizing the gripping area, reconfiguring the voltage used to grip the object, retrying the last electrode configuration, etc.). When the logic controller 1110 determines that the object has been grasped, method 1300 proceeds to block 1350.

At block 1350, the logic controller 1110 moves the object from the pick-up area to the drop-off area. The logic controller 1110 controls various actuation motors 1170 in the gripper apparatus 110 to move the gripping surface, and the grasped object(s) from one location to the other.

At block 1360, the logic controller 1110 deactivates the first and second subsets of the selected electrodes (activated per block 1330) to release the grasped object. In various aspects, the logic controller 1110 may monolithically release the object by deactivating all of the electrodes at the same time, while in other aspects, the logic controller 1110 may deactivate a different portions of the electrodes at successive times to "peel" the object from the gripping surface (e.g., in a wave of deactivations or polarity reversals across a gripping surface).

In various aspects, deactivating the first and second subsets includes reversing the polarity of the voltage carried by the electrodes while grasping the object (e.g., switching the first subset from the first polarity to the second polarity and switching the second subset from the second polarity to the first polarity). Additionally or alternatively, deactivating the first and second subsets includes grounding or applying a zero-voltage voltage to the electrodes. The selection and application of different voltages to deactivate the different electrodes is discussed in greater detail in regard to method 1500 in relation to FIG. 15.

When moving multiple objects at once from the pick-up area to the drop-off area, method 1300 may perform different instances of block 1360 and block 1370 in succession to change the relative positions of the objects from the pick-up area to the drop-off area (e.g., adjusting the location of the gripper apparatus 110 to adjust where a first object and a second object are released relative to where the objects where picked up), to pick up and drop off from different areas, or stack multiple objects (e.g., picking up adjacent objects and layering the objects on drop off).

At block 1370, the logic controller 1110 determines whether the object has been released. In various aspects, the logic controller 1110 receives inputs from various pixel sensors 1160 used to determine whether the object has been grasped (per block 1340), to determine whether the object is still grasped. When the logic controller 1110 determines that the object has been released (e.g., is no longer grasped), method 1300 may conclude, or may continue if further objects are grasped and are to be released. When the logic controller determines that the object has not been released and is still grasped, despite the associated first and second subsets of electrodes being deactivated (per block 1360), method 1300 proceeds to block 1380.

At block 1380, the logic controller 1110 activates one or more secondary release mechanisms 1180 to disengage the object from the gripping surface of the gripper apparatus 110. In various aspects, the secondary release mechanisms 1180 can include air vents that use blowing air to disengage the object, plungers (e.g., controlled by a solenoid, motor, or spring) to push the object off of the gripping surface, or the electrodes in an alternative voltage-carrying arrangement from the gripping arrangement (e.g., grounding the electrodes, setting all of the electrodes to one polarity, setting the electrodes to a higher voltage and the opposite polarity than the gripping voltage/polarity). Method 1300 then returns to block 1370 to determine if further action is needed to release the object.

Figure 14:
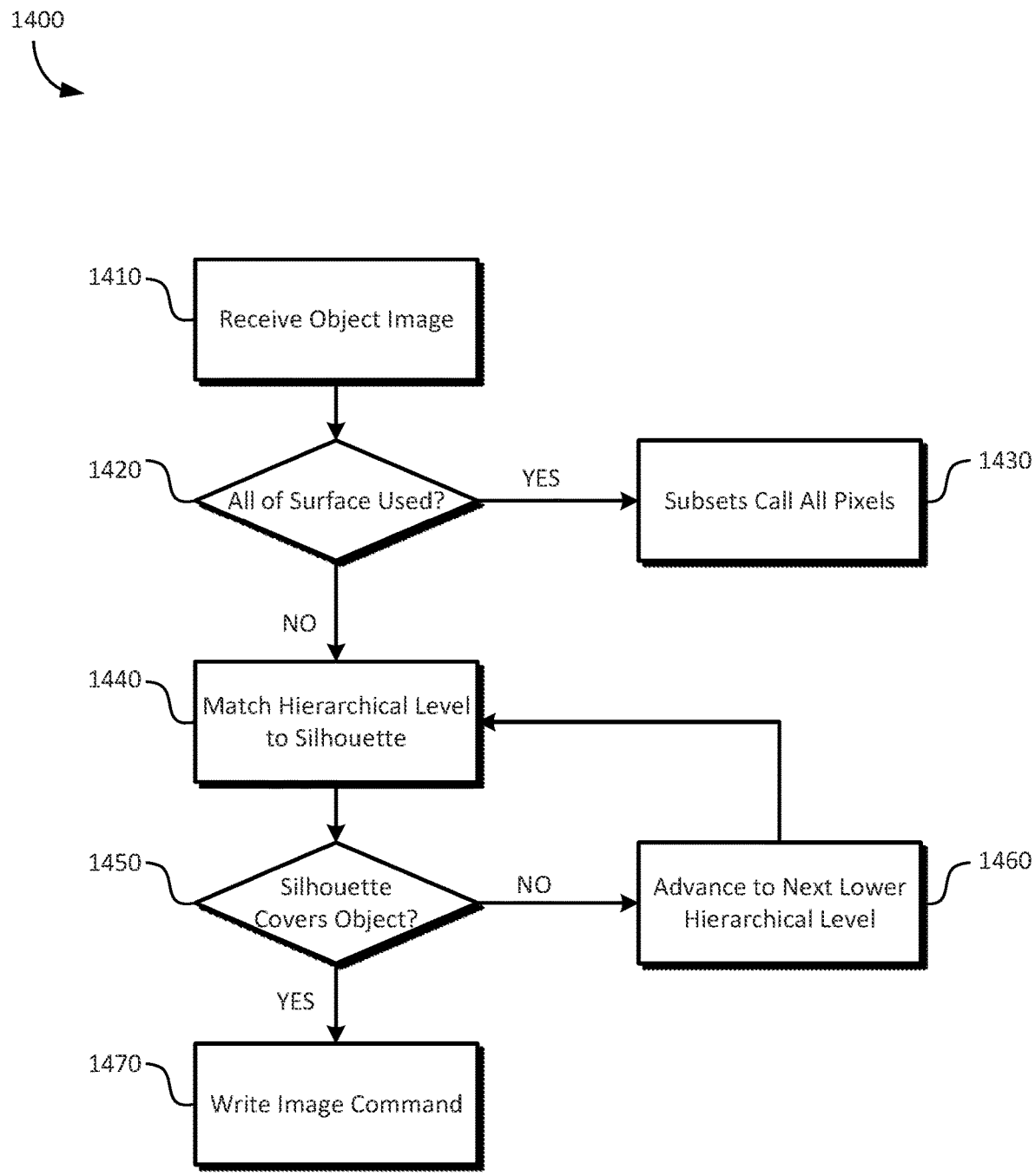
FIG. 14 is a flowchart of a method for controlling to activate electrodes in a gripper apparatus when gripping an object, according to aspects of the present disclosure.

FIG. 14 is a flowchart of a method for controlling to activate electrodes in a gripper apparatus when gripping an object, according to aspects of the present disclosure. Control software, either in the logic controller 1110 or an external computer, builds an image of the surface of an object to be gripped using progressively smaller blocks of the gripper apparatus 110. This "silhouette" of the object can be mapped to various electrodes in the gripper apparatus 110 so that the selected electrodes cover at least the silhouette to grasp the object. Stated differently, the silhouette is used to match or correlate the shape of the object to a correspondingly shaped region of the plurality of electrodes available for gripping. Because the shape of object may be irregular or otherwise imprecisely matched to the shapes of the various electrodes, the selected electrodes may describe more area than the initial surface area. For example, when the surface of the object is circular, the silhouette may described a "pixelated" circle (based on the size/shape/arrangement of the electrode pixels) that can include the surface to be gripped within the silhouette.

When selecting the subsets of the electrode pixels, the logic controller 1110 can hieratically activate different supersets of electrode pixels to thereby simplify control of the gripper apparatus. The silhouette is broken up into a series of zones, tiles, and cells matched to the various electrodes. Accordingly, the logic controller 1110 uses a compressed silhouette to control the largest sets of electrodes as unified wholes, before using smaller sets of electrodes. Accordingly, the logic controller 1110 can activate all of the sub-units in a selected in a larger or higher-level block, thus avoiding the need to control individual tiles when a superset of tiles can instead be controlled.

Method 1400 begins at block 1410, where the logic controller 1110 receives an image of the object. In various aspects, the image is the silhouette of the surface of the object that the gripper apparatus 110 is to grasp, while in other aspects, the logic controller 1110 converts a two-dimensional image of the object (or one surface thereof) into a silhouette based on the size, orientation, and arrangement of the electrode pixels of the associated gripper apparatus.

At block 1420, the logic controller 1110 determines whether all of the gripping surface is used to describe the silhouette. When the silhouette uses all of the gripping surface, method 1400 proceeds to block 1430, where the logic controller calls all of the available pixels for the first and second subsets to grasp a given object. When the silhouette uses less than all of the gripping surface, method 1400 proceeds to block 1440.

At block 1440, the logic controller 1110 matches the highest current hierarchical level of the gripping surface to the silhouette. For example, when the gripping surface is laid out into an array of 9×8 zones, where each zone is laid out into a 1×8 array of cells, each cell is laid out in an 12×1 array of tiles, and each tile is layout out in an 12×1 array of pixels, the hierarchy includes four levels (e.g., zones>cells>tiles>pixels) to describe the silhouette, the logic controller 1110 initially attempts to match whole zones to the silhouette, then whole cells, whole tiles, and finally individual pixels. As will be appreciated, the logic controller 1110 can describe the silhouette using more or fewer than four hierarchical levels, and the hierarchical levels can have different array sizes/shapes from those given in the above example.

At block 1450, the logic controller 1110 determines whether the silhouette covers the object. When the silhouette does not cover all of the object, method 1400 proceeds to block 1460, where the logic controller 1110 selects the next lower hierarchical level and returns to block 1440 to attempt matching the next-lower hierarchical level to the gripping surface to the silhouette.

In various aspects the logic controller 1110 can match various hierarchical levels to the silhouette so that a superset is not called (until the lowest level) unless the surface complete covers the corresponding electrodes. For example, when a surface partially covers a first zone (in the highest hierarchical level), the logic controller 1110 does not match a first level hierarchical level to the surface, and instead waits to use lower hierarchical levels within the first zone to describe the silhouette. Once the logic controller 1110 reaches the lowest hierarchical level (e.g., pixels), the logic controller 1110 begins matching the silhouette beyond the initial outline of the surface of the object. Similarly, the logic controller 1110 can use images files that define the silhouette in various formats that can be broken down into smaller sub-images to form a mosaic to describe subsections of the image. Stated differently, an image of a "whole pad" layout can be broken into a series of smaller images that can be handled by appropriate zones of the surface, or several small images can be combined to form a "whole pad" layout.

When the silhouette covers all of the surface (or extends beyond the surface), method 1400 proceeds to block 1440. At block 1470, the logic controller 1110 writes the image command to the individual electrodes in the selected hierarchical levels. In various aspects, the selected hierarchical levels are divided into two subsets of electrodes across the hierarchical array so that a first subset carries voltages at a first polarity and a second subset carries voltage at a second (opposite) polarity to electrostatically grip the object according to the silhouette for the object.

Method 1400 may repeat when multiple objects are to be grasped simultaneously, where any electrodes that have been excluded from the first subset and the second subset of electrodes for the earlier laid-out objects (e.g., based on a shape and location of the first object to be grasped via the first subset and the second subset of electrodes) are available for use in grasping the second (or subsequent) object. In various aspects, when multiple objects are to be grasped at one time a buffer of at least one pixel that is set around each of the currently placed objects before the logic controller 1110 attempts to grasp a subsequent object at the same time as the previously laid-out objects. These buffer pixels are defined around the border of the various silhouettes, and may be shared by multiple silhouettes as a third subset of pixels that remain inactivated when grasping the various objects.

Figure 15:
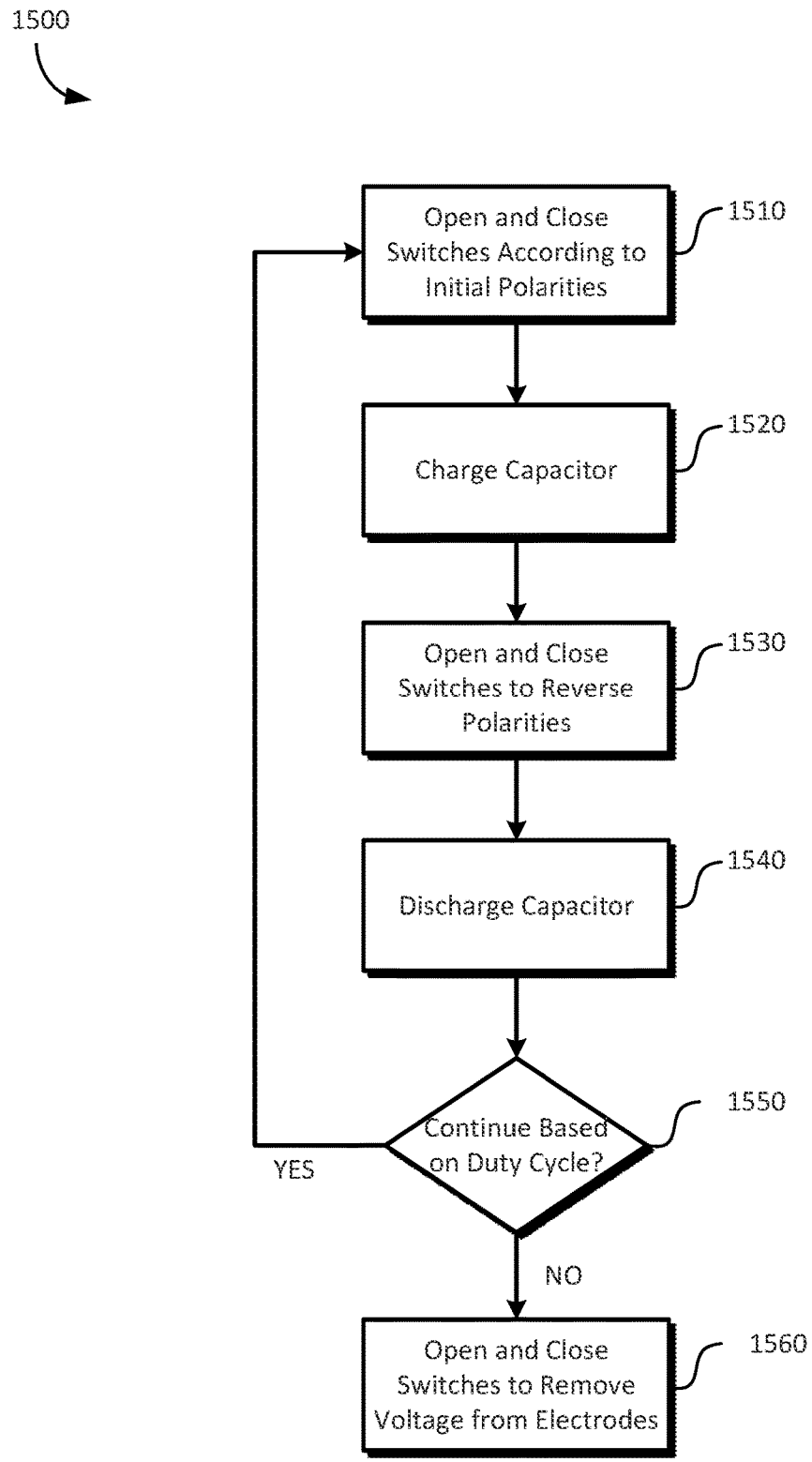
FIG. 15 is a flowchart of a method for controlling a switching unit, according to aspects of the present disclosure.

FIG. 15 is a flowchart of a method 1500 for controlling a switching unit, according to aspects of the present disclosure. Method 1500 begins at block 1510, where the logic controller 1110 opens and close the various switches in a switching unit, such as the switches 1021 of the switching unit 1000 discussed in relation to FIG. 10, according to an initial assignment of a first polarity for a first subset of electrodes and a second polarity for a second set of electrodes. In various aspects, each subset of electrodes includes an enabling switch to selectively receive the current at the first polarity or the second polarity (or to not receive the current) and one or more electrode pixels that are energized by the associated current. The various pixels may be arranged such that each electrode in the first subset is adjacent to at least one electrode in the second subset (and vice versa).

At block 1520, the logic controller 1110 charges the capacitor(s) 1023 in the switching units 1000 while providing the initial polarity voltage to the associated electrodes. The capacitors 1023 associated with the first subset of electrodes are charged while the first subset is activated to carry the voltage at the first polarity and the capacitors 1023 associated with the second subset of electrodes are charged while the second subset of electrodes is activated to carry the voltage at the second polarity.

At block 1530, the logic controller 1110 opens and closes the various switches 1021 in the switching unit 1000 to reverse the initially selected polarities. Accordingly, when the first subset of electrodes were activated per block 1510 to carry the first polarity, the first subset of electrodes is activated to carry the second polarity in block 1530. Similarly, when the second subset of electrodes were activated per block 1510 to carry the second polarity, the second subset of electrodes is activated to carry the first polarity in block 1530. In various aspects, the logic controller 1110 disconnects the switching unit from the power source used to supply the current according to the initial polarity (per block 1510) and charge the capacitor 1023 (per block 1520), and opens/closes the switches 1021 to use the capacitor 1023 as a power source for the electrode pixels.

In various aspects, the logic controller 1110 determines to advance method 1500 to block 1530 in response to a release command (e.g., to stop gripping an object), in response to a duty cycle timer (e.g., at least X milliseconds (ms) have elapsed since block 1510), a voltage or current measurement of the gripped object (e.g., the object being gripped carries at least Y milliamps (mA) of current), or the like.

At block 1540, the logic controller 1110 discharges the capacitor 1023 charged per block 1520. Because the switches 1021 in the associated switching units 1000 are configured to provide power from the capacitor 1023 at the reverse polarity to that initially provided from the power source, the electrodes that carry the voltage at the first polarity per block 1510 carry the voltage at the second polarity in block 1540. Similarly, the electrodes that carry the voltage at the second polarity per block 1510 carry the voltage at the first polarity in block 1540. Any electrodes not selected by the logic controller 1110 to carry voltage per block 1510 (e.g., non-activated electrodes) remain non-activated at block 1540.

In various aspects, the logic controller 1110 can apply a constant initial polarities (per block 1510) via the selected subsets of electrodes while gripping the object and apply the opposing polarities (per block 1540) to release the object. In some aspects, the logic controller 1110 alternates between the initial polarity and the opposing polarity according to a duty cycle while gripping the object (per blocks 1510-1540) and releases the object by removing or no longer applying a voltage to the electrodes (per block 1560).

In some examples, a duty cycle specifies how long the first and second polarities are applied and when to switch polarities in the corresponding electrodes. In various aspects, the duty cycle may cycle between the opposing polarities every X ms or when the object being gripped begins to conduct a threshold amount of Y mA of current. The logic controller 1110 may set the value of X or Y based on the material of the object being gripped, a thickness or weight of the object being gripped, the frequency of the AC power source (e.g., 60 Hertz (Hz), 50 Hz, Z Hz), the capacitive and inductive properties of the gripper apparatus, or the like. For example, a duty cycle that switches various electrode pixels on and off between every 10 ms and 18 ms can be used when gripping carbon fiber plies. In various aspects, the duty cycle is even (e.g., a 50% duty cycle with X ms at the initial polarity and X ms at the reverse polarity), uneven (e.g., X ms at the initial polarity, 2X ms or 0.5X ms at the reverse polarity), or may change over time e.g., X ms at the initial polarity, X ms at the reverse polarity, then 2X ms at the initial polarity, 2X ms at the reverse polarity, etc.).

Using a constant polarity scheme allows the reversal in polarity to help remove the object from the gripper apparatus 110 due to the applied charges in the object from the electrodes. For example, a section of the object gripped by positive polarity electrodes may begin to experience a negative polarity in the material matrix of the object (at least at the surface level), which aids in gripping the object. This induced negative polarity in the object is then repelled from the electrodes when switched to a negative polarity, thus aiding in object release. However, fabricators may wish to avoid inducing a charge in some of the objects that are gripped, and may specify a duty cycle to switch between positive and negative polarities, thereby avoiding charging the object or reducing the amount of charge applied to the object when gripped.

Additionally or alternatively, when the logic controller 1110 receives a command to drop all objects currently being gripped, the logic controller 1110 can drive the electrodes all be the same polarity (e.g., all positive or all negative) for a short duration (e.g., X ms) to assist in releasing the material. In another aspect, the logic controller 1110 can continue driving the electrodes at the assigned duty cycle, but reduce the voltage applied to the electrodes below the electroadhesion threshold for the material(s) being gripped. Accordingly, the reduced voltage and continue cycling can reduce the built-up charges in the objects and the pad while releasing all objects gripped by the section of the pad in which voltage is reduced.

Accordingly, at block 1550, the logic controller 1110 determines whether the object is being gripped according to a duty cycle, and whether to continue based on that duty cycle. When the logic controller 1110 determines to continue based on the duty cycle, method 1500 returns to block 1510 for the logic controller 1110 to apply the initial polarity voltage to the electrodes. When the logic controller 1110 determines to not continue based on the duty cycle, either to release the object when using an alternating polarity gripping scheme or when using a constant polarity gripping scheme (e.g., with no-duty cycle) that released the object per blocks 1530-1540, method 1500 proceeds to block 1560. In various aspects, depending on the length of the duty cycle and the time needed to move the object, the logic controller 1110 may convert the final cycle of the duty cycle to a constant polarity scheme; keeping the object gripped according to initial polarity assignments until a release command is received, and responsively switching to the opposing polarities to release the object.

At block 1560, the logic controller 1110 opens and closes the various switches 1021 in the switching unit 1000 to remove voltage from the electrodes. In various aspects, the logic controller 1110 may continue to discharge any remaining charge in the capacitor 1023 (e.g., via a bleed-off resistor), but does not direct the capacitor 1023 to power the electrodes. Method 1500 may then conclude.

Example Processing System and Controller

FIG. 16 depicts a schematic view of an computing system 1600 that can be used according to the systems and methods described herein. The computing system 1600 includes a processor 1660 (e.g., a central processing unit (CPU)) in data communication with a memory 1650, an input device 1670, and an output device 1680. Although described separately, it is to be appreciated that functional blocks described with respect to the computing system 1600 need not be separate structural elements. For example, the processor 1660 and memory 1650 can be embodied in a single chip. The processor 1660 can be a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. A processor may also be implemented as a combination of computing devices, e.g., a combination of a DSP and a microprocessor, a plurality of microprocessors, one or more microprocessors in conjunction with a DSP core, or any other such configuration.

The processor 1660 can be coupled, via one or more buses, to read information from or write information to memory 1650. The processor may additionally, or in the alternative, contain memory, such as processor registers. The memory 1650 can include processor cache, including a multi-level hierarchical cache in which different levels have different capacities and access speeds. The memory 1650 can also include random access memory (RAM), other volatile storage devices, or non-volatile storage devices. The storage can include hard drives, flash memory, etc. Memory 1650 can also include a computer program product embodied on memory 1650 comprising code such as a motion system control application 1656 that is used to control a position and orientation of the pixelated pad as discussed in relation to FIGS. 2 and 6A-6B, a voltage control application 1654 that is used to control the voltage inputs as discussed in relation to FIGS. 3B and 4, or a heating control application 1658 that is used to control voltage or power to a heating element as discussed in relation to FIG. 3B. Control applications 1654, 1656, and 1658 may be code that can be executed by processor 1660. In various instances, the memory is referred to as a computer-readable storage medium or a non-transitory computer-readable medium. The computer-readable storage medium is a non-transitory device capable of storing information and is distinguishable from computer-readable transmission media such as electronic transitory signals capable of carrying information from one location to another. The non-transitory computer readable medium includes computer-executable instructions that, when executed by a processing system, cause the processing system to perform a method, as described in relation to FIGS. 2 and 3A-6B, including grasping an object via a substrate comprising a plurality of electrode pixels, and selectively energizing each electrode pixel of the plurality of electrode pixels via a controller. In some embodiments, the method performed by the processing system includes determining a shape of the object and energizing, via the controller, a subset of electrode pixels of the plurality of electrode pixels based on the shape of the object. In some embodiments, the method performed by the processing system includes positioning the substrate adjacent to the object via a motion system. In some embodiments, the method performed by the processing system includes positioning the substrate based on a distance measurement between the substrate and the object. In some embodiments, the method performed by the processing system includes energizing, via the controller, at least one heating element configured to heat the substrate. Computer-readable medium as described herein may generally refer to a computer-readable storage medium or computer-readable transmission medium.

The processor 1660 also may be coupled to an input device 1670 and an output device 1680 for, respectively, receiving input from and providing output to the computing system 1600. Input devices 1670 may be part of a distance measurement system 208 or may be a substrate temperature sensor 1678. Suitable input devices from the distance measurement system 208 include, but are not limited to a video camera (possibly coupled with video processing software to, e.g., detect a position of a pixelated pad (e.g., the pixelated pad 202 in FIG. 2) or of an object to be grasped by the pixelated pad, an encoder (e.g., an optical or magnetic, capacitive, or inductive encoder), a resolver, a potentiometer, an angle sensor, an accelerometer, a gyroscope, an inertial measurement unit, a global positioning system, or a motion detector and the like. For example, the input device 1670 may include a position sensor such as an encoder or angle position sensor as discussed in relation to FIG. 2. The substrate temperature sensor 1678 may be at least one of a thermocouple, resistance temperature detector, thermistor, or a semiconductor based integrated circuit. Suitable output devices include, but are not limited to, the motion system 206 as discussed in relation to FIGS. 2 and 6A-6B, the plurality of electrode pixels 212 as discussed in relation to 2 and 3A-6B, and the heating element 328 as discussed in relation to FIG. 3B.

Aspects of the present disclosure have been described above with reference to specific embodiments. Persons skilled in the art, however, will understand that various modifications and changes may be made thereto without departing from the broader spirit and scope of the present disclosure as set forth in the appended claims. The foregoing description and drawings are, accordingly, to be regarded in an illustrative rather than a restrictive sense.

EXAMPLE CLAUSES

Implementation examples are described in the following numbered clauses:

Clause 1: A control unit, comprising: a voltage converter configured to increase an input voltage to an output voltage; a first gripping circuit, configured to selectively provide the output voltage at a first polarity to a first subset of electrodes of a plurality of electrodes; a second gripping circuit, configured to selectively provide the output voltage at a second polarity opposite to the first polarity to a second subset of electrodes of a plurality of electrodes that are associated with and different from the first subset of electrodes; a first release circuit, configured to selectively reverse the output voltage provided to the first subset of electrodes to the second polarity; and a second release circuit, configured to selectively reverse the output voltage provided to the second subset of electrodes to the first polarity.

Clause 2: A control unit as is described in any of Clauses 1 and 3-5, wherein each of the first gripping circuit and the first release circuit further comprise: a first switch connected between the voltage converter and a first node; a capacitor connected between the first node and a second node; a second switch connected between the second node and an electrode control node for the first subset of electrodes; a third switch connected between the second node and ground; a fourth switch connected between the first node and ground; and a fifth switch connected between the first node and the electrode control node.

Clause 3: A control unit as is described in any of Clauses 1, 2, 4, and 5, wherein the first gripping circuit and the first release circuit are configured to: when providing the output voltage at the first polarity to the first subset of electrodes: open the first switch, the third switch, and the fifth switch; and close the second switch and the fourth switch; and when providing the output voltage at the second polarity to the first subset of electrodes with: close the first switch, the third switch, and the fifth switch; and open the second switch and the fourth switch.

Clause 4: A control unit as is described in any of Clauses 1-3 and 4 wherein the first subset of electrodes comprises: an enabling switch connected between the electrode control node and a third node; and at least one electrode pixel of a predefined shape and location in the plurality of electrodes.

Clause 5: A control unit as is described in any of Clauses 1-4, further comprising: a processor, configured to identify which electrodes of the plurality of electrodes to include in the first subset of electrodes or in the second subset of electrodes and which electrodes of the plurality of electrodes to exclude from both the first subset and the second subset of electrodes based on a shape and location of an object to be grasped via the first subset and the second subset of electrodes.

Clause 6: An apparatus, comprising: a gripper apparatus, configured to electrostatically grasp an object via a plurality of electrodes; a control unit, configured to: command the gripper apparatus to grasp the object by: selecting individual electrodes of the plurality of electrodes to grasp the object; activating a first subset of the electrodes to carry a voltage at a first duty cycle; activating a second subset of the electrodes to carry the voltage at a second duty cycle, different from the first duty cycle; and release the object from the gripper apparatus by: applying the voltage according to a third duty cycle, different from the first duty cycle, to the first subset of the electrodes; and applying the voltage according to a fourth duty cycle, different from the second duty cycle, to the second subset of the electrodes.

Clause 7: An apparatus as is described in any of Clauses 6 and 8-12, wherein the first duty cycle and the fourth duty cycle constantly apply the voltage according to a first polarity and the second duty cycle and the fourth duty cycle constantly apply the voltage according to a second polarity opposite to the first polarity.

Clause 8: An apparatus as is described in any of Clauses 6, 7, and 9-12, wherein the control unit reverses the first polarity to the second polarity in the first subset when releasing the object by: charging a first capacitor associated with the first subset while the first subset is activated to carry the voltage at the first polarity; and in response to disconnecting a voltage supply from the first subset: discharging the first capacitor to the first subset at the second polarity.

Clause 9: An apparatus as is described in any of Clauses 6-8 and 10-12, wherein the first duty cycle and the second duty cycle constantly cycle between a first polarity and a second polarity opposite to the first polarity at an equal cycle frequency, and wherein the third duty cycle and the fourth duty cycle constantly apply a ground voltage to the first subset and the second subset of the electrodes.

Clause 10: An apparatus as is described in any of Clauses 6-9, 11, and 12, wherein cycling between the first polarity and the second polarity further comprises: charging a first capacitor associated with the first subset while the first subset is activated to carry the voltage at the first polarity during a first half of the equal cycle frequency; charging a second capacitor associated with the second subset while the second subset is activated to carry the voltage at the second polarity during the first half of the equal cycle frequency; discharging the first capacitor while the first subset is activated to carry the voltage at the second polarity during a second half of the equal cycle frequency; and discharging the second capacitor while the second subset is activated to carry the voltage at the first polarity during the second half of the equal cycle frequency.

Clause 11: An apparatus as is described in any of Clauses 6-10 and 12, wherein the control unit is further configured to, in response to activating the first subset and the second subset of the electrodes, verify via an optical sensor that the object is electrostatically held to the gripper apparatus, wherein the control unit is further configured to, after applying the voltage according to a third duty cycle and the fourth duty cycle, and in response to determining via the optical sensor that the object is still held to the gripper apparatus, activate a solenoid release mechanism included in the gripper apparatus.

Clause 12: An apparatus as is described in any of Clauses 6-11, wherein each electrode of the first subset is adjacent to at least one electrode of the second subset and each electrode of the second subset is adjacent to at least one electrode of the first subset.

Clause 13: A method, comprising: in response to receiving a first command to grasp an object via a gripper apparatus comprising a plurality of electrodes: identifying at least two electrodes of the plurality of electrodes to associate with the object; and activating the at least two identified electrodes for a first subset of the at least two identified electrodes to carry a voltage at a first polarity and a second subset of the at least two identified electrodes to carry the voltage at a second polarity opposite to the first polarity; and in response to receiving a second command to release the object from the gripper apparatus, reversing polarities of the voltage in the first subset and the second subset.

Clause 14: A method as is described in any of Clauses 13 and 15-20, further comprising, in response to activating the at least two identified electrodes, verifying via an optical sensor that the object is electrostatically held to the gripper apparatus.

Clause 15: A method as is described in any of Clauses 13, 14, and 16-20, further comprising, in response to receiving the second command to release the object from the gripper apparatus: activating a solenoid release mechanism included in the gripper apparatus.

Clause 16: A method as is described in any of Clauses 13-15, and 17-20, further comprising, after reversing the first polarity of the voltage, verifying via an optical sensor that the object is electrostatically no longer held to the gripper apparatus, wherein the solenoid release mechanism is activated in response to determining that the object is still held to the gripper apparatus.

Clause 17: A method as is described in any of Clauses 13-16 and 18-20, wherein each electrode of the plurality of electrodes is an individually controllable electrode pixel, wherein the plurality of electrodes are arranged in a grid pattern with adjacent electrode pixels configured to operate at alternating voltage polarities to one another.

Clause 18: A method as is described in any of Clauses 13-17, 19, and 20, wherein reversing the polarities of the voltage in the first subset and the second subset further comprises: charging a first capacitor associated with the first subset while the first subset carries the voltage at the first polarity; charging a second capacitor associated with the second subset while the second subset carries the voltage at the second polarity; in response to disconnecting a voltage supply from the first subset, discharging the first capacitor to the first subset at the second polarity; and in response to disconnecting the voltage supply from the second subset, discharging the second capacitor to the second subset at the first polarity.

Clause 19: A method as is described in any of Clauses 18-17 and 20, wherein identifying the at least two electrodes of the plurality of electrodes to associate with the object further comprises: receiving an image of a shape the object; receiving a location of the object in a pick-up area; and matching the shape to a correspondingly shaped region of the plurality of electrodes, wherein the correspondingly shaped region is located in the plurality of electrodes to correspond to the location of the object in the pick-up area when the gripper apparatus is disposed in the pick-up area.

Clause 20: A method as is described in any of Clauses 13-19, wherein activating the at least two identified electrodes includes heating the at least two identified electrodes to a predefined temperature range.

Additional Considerations

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A control unit, comprising:
   a voltage converter configured to increase an input voltage to an output voltage;
   a first gripping circuit, configured to selectively provide the output voltage at a first polarity to a first subset of electrodes of a plurality of electrodes;
   a second gripping circuit, configured to selectively provide the output voltage at a second polarity opposite to the first polarity to a second subset of electrodes of a plurality of electrodes that are associated with and different from the first subset of electrodes;

a first release circuit, configured to selectively reverse the output voltage provided to the first subset of electrodes to the second polarity; and a second release circuit, configured to selectively reverse the output voltage provided to the second subset of electrodes to the first polarity.

2. The control unit of claim 1, wherein each of the first gripping circuit and the first release circuit further comprise:

a first switch connected between the voltage converter and a first node;

a capacitor connected between the first node and a second node;

a second switch connected between the second node and an electrode control node for the first subset of electrodes;

a third switch connected between the second node and ground;

a fourth switch connected between the first node and ground; and a fifth switch connected between the first node and the electrode control node.

3. The control unit of claim 2, wherein the first gripping circuit and the first release circuit are configured to:

when providing the output voltage at the first polarity to the first subset of electrodes:
  open the first switch, the third switch, and the fifth switch; and
  close the second switch and the fourth switch; and when providing the output voltage at the second polarity to the first subset of electrodes with:
  close the first switch, the third switch, and the fifth switch; and
  open the second switch and the fourth switch.

4. The control unit of claim 2, wherein the first subset of electrodes comprises:

an enabling switch connected between the electrode control node and a third node; and at least one electrode pixel of a predefined shape and location in the plurality of electrodes.

5. The control unit of claim 1, further comprising:

a processor, configured to identify which electrodes of the plurality of electrodes to include in the first subset of electrodes or in the second subset of electrodes and which electrodes of the plurality of electrodes to exclude from both the first subset and the second subset of electrodes based on a shape and location of an object to be grasped via the first subset and the second subset of electrodes.

6. An apparatus, comprising:

a gripper apparatus, configured to electrostatically grasp an object via a plurality of electrodes;

a logic controller, configured to:
  command the gripper apparatus to grasp the object by:
    selecting individual electrodes of the plurality of electrodes to grasp the object;
    activating a first subset of the individual electrodes to carry a voltage at a first duty cycle;
    activating a second subset of the individual electrodes to carry the voltage at a second duty cycle, different from the first duty cycle; and
  release the object from the gripper apparatus by:
    applying the voltage according to a third duty cycle, different from the first duty cycle, to the first subset of the individual electrodes; and
    applying the voltage according to a fourth duty cycle, different from the second duty cycle, to the second subset of the individual electrodes.

7. The apparatus of claim 6, wherein the first duty cycle and the fourth duty cycle constantly apply the voltage according to a first polarity and the second duty cycle and the fourth duty cycle constantly apply the voltage according to a second polarity opposite to the first polarity.

8. The apparatus of claim 7, wherein the logic controller reverses the first polarity to the second polarity in the first subset when releasing the object by:

charging a first capacitor associated with the first subset while the first subset is activated to carry the voltage at the first polarity; and in response to disconnecting a voltage supply from the first subset:
  discharging the first capacitor to the first subset at the second polarity.

9. The apparatus of claim 6, wherein the first duty cycle and the second duty cycle constantly cycle between a first polarity and a second polarity opposite to the first polarity at an equal cycle frequency, and wherein the third duty cycle and the fourth duty cycle constantly apply a ground voltage to the first subset and the second subset of the individual electrodes.

10. The apparatus of claim 9, wherein cycling between the first polarity and the second polarity further comprises:

charging a first capacitor associated with the first subset while the first subset is activated to carry the voltage at the first polarity during a first half of the equal cycle frequency;

charging a second capacitor associated with the second subset while the second subset is activated to carry the voltage at the second polarity during the first half of the equal cycle frequency;

discharging the first capacitor while the first subset is activated to carry the voltage at the second polarity during a second half of the equal cycle frequency; and discharging the second capacitor while the second subset is activated to carry the voltage at the first polarity during the second half of the equal cycle frequency.

11. The apparatus of claim 6, wherein the logic controller is further configured to, in response to activating the first subset and the second subset of the individual electrodes, verify via an optical sensor that the object is electrostatically held to the gripper apparatus, wherein the logic controller is further configured to, after applying the voltage according to a third duty cycle and the fourth duty cycle, and in response to determining via the optical sensor that the object is still held to the gripper apparatus, activate a solenoid release mechanism included in the gripper apparatus.

12. The apparatus of claim 6, wherein each electrode of the first subset is adjacent to at least one electrode of the second subset and each electrode of the second subset is adjacent to at least one electrode of the first subset.

13. A method, comprising:

in response to receiving a first command to grasp an object via a gripper apparatus comprising a plurality of electrodes:
  selecting at least two electrodes of the plurality of electrodes to associate with the object; and
  activating the at least two electrodes for a first subset of the at least two electrodes to carry a voltage at a first polarity at a first duty cycle and a second subset of the at least two electrodes to carry the voltage at a second polarity opposite to the first polarity at a second duty cycle, different from the first duty cycle; and in response to receiving a second command to release the object from the gripper apparatus, reversing polarities of the voltage in the first subset and the second subset.

14. The method of claim 13, further comprising, in response to activating the at least two electrodes, verifying via an optical sensor that the object is electrostatically held to the gripper apparatus.

15. The method of claim 13, further comprising, in response to receiving the second command to release the object from the gripper apparatus:
activating a solenoid release mechanism included in the gripper apparatus.

16. The method of claim 15, further comprising, after reversing the first polarity of the voltage, verifying via an optical sensor that the object is electrostatically no longer held to the gripper apparatus, wherein the solenoid release mechanism is activated in response to determining that the object is still held to the gripper apparatus.

17. The method of claim 13, wherein each electrode of the plurality of electrodes is an individually controllable electrode pixel, wherein the plurality of electrodes are arranged in a grid pattern with adjacent electrode pixels configured to operate at alternating voltage polarities to one another.

18. The method of claim 13, wherein reversing the polarities of the voltage in the first subset and the second subset further comprises:

charging a first capacitor associated with the first subset while the first subset carries the voltage at the first polarity;

charging a second capacitor associated with the second subset while the second subset carries the voltage at the second polarity;

in response to disconnecting a voltage supply from the first subset, discharging the first capacitor to the first subset at the second polarity; and in response to disconnecting the voltage supply from the second subset, discharging the second capacitor to the second subset at the first polarity.

19. The method of claim 13, wherein selecting the at least two electrodes of the plurality of electrodes to associate with the object further comprises:

receiving an image of a shape the object;

receiving a location of the object in a pick-up area; and matching the shape to a correspondingly shaped region of the plurality of electrodes, wherein the correspondingly shaped region is located in the plurality of electrodes to correspond to the location of the object in the pick-up area when the gripper apparatus is disposed in the pick-up area.

20. The method of claim 13, wherein activating the at least two electrodes includes heating the at least two electrodes to a predefined temperature range.

* * * * *